(12) United States Patent
Soethoudt et al.

(10) Patent No.: US 10,599,053 B2
(45) Date of Patent: *Mar. 24, 2020

(54) LITHOGRAPHIC APPARATUS AND METHOD FOR LOADING A SUBSTRATE

(71) Applicant: ASML NETHERLANDS B.V., Veldhoven (NL)

(72) Inventors: Abraham Alexander Soethoudt, Eindhoven (NL); Thomas Poiesz, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 16/511,867

(22) Filed: Jul. 15, 2019

(65) Prior Publication Data

US 2019/0339627 A1    Nov. 7, 2019

Related U.S. Application Data

(63) Continuation of application No. 15/569,135, filed as application No. PCT/EP2016/061587 on May 23, 2016, now Pat. No. 10,353,303.

(30) Foreign Application Priority Data

Jun. 11, 2015   (EP) ..................... 15171545

(51) Int. Cl.
*G03B 27/58*    (2006.01)
*G03F 7/20*     (2006.01)
(Continued)

(52) U.S. Cl.
CPC ....... *G03F 7/70866* (2013.01); *B01D 53/346* (2013.01); *B01D 53/56* (2013.01);
(Continued)

(58) Field of Classification Search
CPC ... G03F 7/707; G03F 7/70783; G03F 7/70866
See application file for complete search history.

(56) References Cited

U.S. PATENT DOCUMENTS 4,509,852 A    4/1985   Tabarelli et al.
4,561,688 A    12/1985  Tsutsui
(Continued)

FOREIGN PATENT DOCUMENTS

CN    101681124 A    3/2010
CN    105683839 A    6/2016
(Continued)

OTHER PUBLICATIONS

International Search Report dated Aug. 18, 2016 in corresponding PCT application No. PCT/EP2016/061587.
(Continued)

*Primary Examiner* — Peter B Kim
(74) *Attorney, Agent, or Firm* — Pillsbury Winthrop Shaw Pittman, LLP

(57) ABSTRACT

A lithographic apparatus includes a support table and a gas extraction system. The gas extraction system is configured to extract gas from a gap between the base surface of the support table and a substrate through at least one gas extraction opening when the substrate is being lowered onto the support table. The lithographic apparatus is configured such that gas is extracted from the gap at a first loading flow rate when the distance between the substrate and the support plane is greater than a threshold distance and gas is extracted from the gap at a second loading flow rate when the distance between the substrate and the support plane is less than the threshold distance, wherein the second loading flow rate is lower than the first loading flow rate.

20 Claims, 13 Drawing Sheets

(51) Int. Cl.
- *B01D 53/34* (2006.01)
- *B01D 53/56* (2006.01)
- *B01D 53/79* (2006.01)
- *B05B 13/02* (2006.01)
- *B05B 13/04* (2006.01)
- *F23J 15/00* (2006.01)
- *B05B 15/656* (2018.01)
- *B05B 15/68* (2018.01)
- *B05B 13/06* (2006.01)

(52) U.S. Cl.
CPC .......... *B01D 53/79* (2013.01); *B05B 13/0278* (2013.01); *B05B 13/041* (2013.01); *B05B 15/656* (2018.02); *B05B 15/68* (2018.02); *F23J 15/003* (2013.01); *G03F 7/707* (2013.01); *G03F 7/70783* (2013.01); *B01D 2251/2062* (2013.01); *B01D 2251/2067* (2013.01); *B01D 2257/402* (2013.01); *B01D 2257/404* (2013.01); *B01D 2258/0283* (2013.01); *B01D 2259/124* (2013.01); *B05B 13/0627* (2013.01); *F23J 2219/20* (2013.01); *Y02C 20/10* (2013.01)

(56) References Cited

U.S. PATENT DOCUMENTS

| | | | |
|---|---|---|---|
| 6,257,564 | B1 | 7/2001 | Avneri et al. |
| 9,835,957 | B2 | 12/2017 | Houben et al. |
| 10,353,303 | B2 * | 7/2019 | Soethoudt .............. B01D 53/56 |
| 2004/0179183 | A1 | 9/2004 | Van Ballegoij et al. |
| 2004/0207824 | A1 | 10/2004 | Lof et al. |
| 2006/0139614 | A1 | 6/2006 | Owa et al. |
| 2008/0316461 | A1 | 12/2008 | Compen |
| 2010/0045949 | A1 | 2/2010 | Nakano et al. |
| 2010/0195080 | A1 | 8/2010 | Compen et al. |
| 2016/0111318 | A1 | 4/2016 | Ichinose |
| 2016/0187791 | A1 | 6/2016 | Houben et al. |
| 2017/0292566 | A1 | 10/2017 | Tromp et al. |

FOREIGN PATENT DOCUMENTS

| | | |
|---|---|---|
| CN | 107077078 A | 8/2017 |
| EP | 1420298 | 5/2004 |
| JP | 03-102850 | 4/1991 |
| JP | 2004-140271 | 5/2004 |
| JP | 2004-281765 | 10/2004 |
| JP | 2007-214336 | 8/2007 |
| JP | 2007-116752 | 8/2009 |
| JP | 2010-530636 | 9/2010 |
| JP | 2015-56626 A | 3/2015 |
| WO | 99/49504 | 9/1999 |
| WO | 2008/156366 | 12/2008 |

OTHER PUBLICATIONS

Japanese Office Action issued in corresponding Japanese Patent Application No. 2017-557204, dated Oct. 24, 2018.
First Office Action dated Aug. 26, 2019 issued in corresponding Chinese Patent Application No. 201680033995.9.

\* cited by examiner

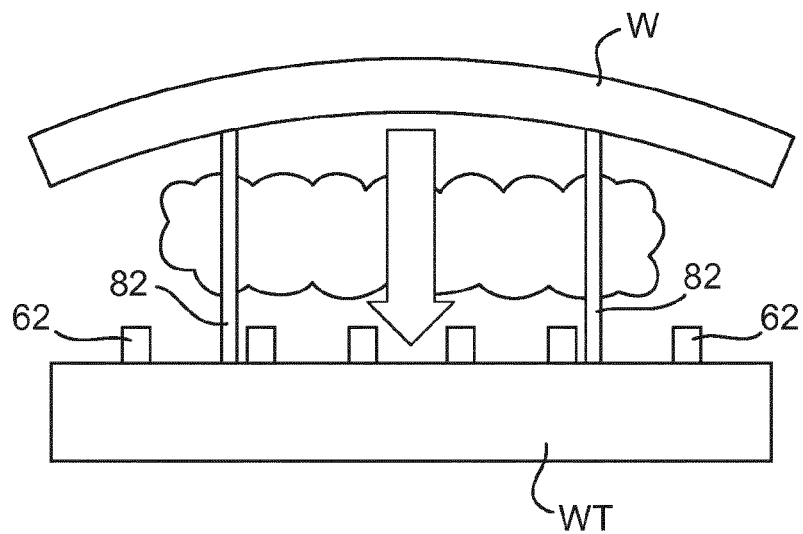
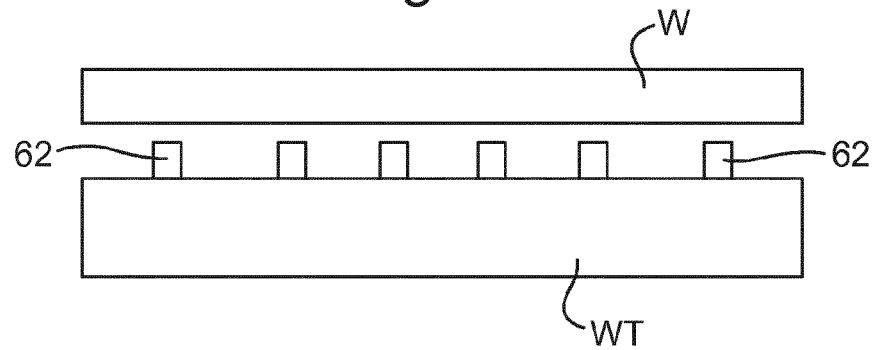

LITHOGRAPHIC APPARATUS AND METHOD FOR LOADING A SUBSTRATE

This application is a continuation of U.S. patent application Ser. No. 15/569,135, which was filed on Oct. 25, 2017, now allowed, which is the U.S. national phase entry of PCT patent application no. PCT/EP2016/061587, which was filed on May 23, 2016, which claims the benefit of priority of European patent application no. 15171545.5, which was filed on Jun. 11, 2015, each of the foregoing applications is incorporated herein in its entirety by reference.

FIELD

The present description relates to a lithographic apparatus and a method for loading a substrate, particularly onto a support table for a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the invention will be described with reference to liquid. However, another fluid may be suitable, particularly a wetting fluid, an incompressible fluid and/or a fluid with higher refractive index than air, desirably a higher refractive index than water.

Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Submersing the substrate or substrate and support table in a bath of liquid (see, for example, U.S. Pat. No. 4,509,852) means that there is a large body of liquid that must be accelerated during a scanning exposure. This requires additional or more powerful motors and turbulence in the liquid may lead to undesirable and unpredictable effects.

In an immersion apparatus, immersion fluid is handled by a fluid handling system, device structure or apparatus. In an embodiment the fluid handling system may supply immersion fluid and therefore be a fluid supply system. In an embodiment the fluid handling system may at least partly confine immersion fluid and thereby be a fluid confinement system. In an embodiment the fluid handling system may provide a barrier to immersion fluid and thereby be a barrier member, such as a fluid confinement structure. In an embodiment the fluid handling system may create or use a flow of gas, for example to help in controlling the flow and/or the position of the immersion fluid. The flow of gas may form a seal to confine the immersion fluid so the fluid handling structure may be referred to as a seal member; such a seal member may be a fluid confinement structure. In an embodiment, immersion liquid is used as the immersion fluid. In that case the fluid handling system may be a liquid handling system. In reference to the aforementioned description, reference in this paragraph to a feature defined with respect to fluid may be understood to include a feature defined with respect to liquid.

SUMMARY

In both an immersion apparatus or in a dry apparatus, a substrate is clamped to a support table during exposure processes. The clamping may be assisted by having the region between the substrate and the support table at a lower pressure compared to ambient pressure. Ambient pressure is the pressure surrounding the substrate and the support table. The region enclosed by the support table and the substrate may be at near vacuum pressure such that the substrate is vacuum clamped to the support table.

The support table comprises one or more holes formed in it. The holes facilitate clamping of the substrate. Gas may be extracted through the holes from the region enclosed by the substrate and the support table, thereby reducing the pressure in this region for clamping of the substrate.

The substrate is loaded onto the support table. During loading of the substrate, the substrate can deform due to gravity. If gas is extracted during loading of the substrate, the substrate can be clamped in its deformed state, which increases overlay. Alternatively, if gas is not extracted during loading of the wafer, it takes a longer time to clamp the substrate to the support table. This increases throughput time of the substrates.

It is desirable, for example, to provide a lithographic apparatus and a method of loading a substrate in which the combination of deformation of the clamped substrate and throughput is improved.

According to an aspect of the invention, there is provided a lithographic apparatus comprising: a support table configured to support a substrate; and a gas extraction system; wherein the support table comprises: a base surface; a plurality of burls protruding above the base surface, each of the plurality of burls having a respective burl distal end, the burl distal ends being arranged in a support plane so as to support the substrate; and at least one gas extraction opening connected to the gas extraction system; and wherein the gas extraction system is configured to extract gas from a gap between the base surface and the substrate through each gas extraction opening when the substrate is being lowered onto the support table; wherein the lithographic apparatus is configured such that gas is extracted from the gap at a first loading flow rate when the distance between the substrate and the support plane is greater than a threshold distance and gas is extracted from the gap at a second loading flow rate when the distance between the substrate and the support plane is less than the threshold distance, wherein the second loading flow rate is lower than the first loading flow rate.

According to an aspect of the invention, there is provided a lithographic apparatus comprising: a support table configured to support a substrate; and a gas extraction system; wherein the support table comprises: a base surface; a plurality of burls protruding above the base surface, each of the plurality of burls having a respective burl distal end, the burl distal ends being arranged in a support plane so as to support the substrate; and at least one protrusion protruding above the base surface, each protrusion having a respective protrusion distal end, wherein the respective protrusion distal end is spaced a loaded substrate distance from the support plane; wherein each protrusion distal end is provided with a gas extraction opening connected to the gas extraction system, wherein each gas extraction opening has a gas extraction opening diameter, wherein the loaded substrate distance is less than half the gas extraction opening diameter; and wherein the gas extraction system is configured to extract gas from a gap between the base surface and the substrate through each gas extraction opening when the substrate is being lowered onto the support table.

According to an aspect of the invention, there is provided a lithographic apparatus comprising: a support table configured to support a substrate; and a gas extraction system; wherein the support table comprises: a base surface; a plurality of burls protruding above the base surface, each of the plurality of burls having a respective burl distal end, the burl distal ends being arranged in a support plane so as to support the substrate; a first group of at least one gas extraction opening connected to the gas extraction system; and a second group of at least one gas extraction opening connected to the gas extraction system; and wherein the gas extraction system is configured to extract gas from a gap between the base surface and the substrate through the first group and the second group when the distance between the substrate and the support plane is greater than a threshold distance such that gas is extracted from the gap at a first loading flow rate when the distance between the substrate and the support plane is greater than a threshold distance; wherein the gas extraction system is configured to stop extracting gas from the gap through the first group when the distance between the substrate and the support plane is less than the threshold distance such that gas is extracted from the gap at a second loading flow rate when the distance between the substrate and the support plane is less than the threshold distance, wherein the second loading flow rate is lower than the first loading flow rate.

According to an aspect of the invention, there is provided a method for loading a substrate onto a support table for a lithographic apparatus, the support table comprising: a base surface; a plurality of burls protruding above the base surface, each of the plurality of burls having a respective burl distal end, the burl distal ends being arranged in a support plane so as to support the substrate; and at least one gas extraction opening configured to extract gas from a gap between the base surface and the substrate when the substrate is being lowered onto the support table; wherein the method comprises: lowering the substrate towards the support table; extracting gas from the gap at a first loading flow rate when the distance between the substrate and the support plane is greater than a threshold distance; and extracting gas from the gap at a second loading flow rate when the distance between the substrate and the support plane is less than the threshold distance, wherein the second loading flow rate is lower than the first loading flow rate.

According to an aspect of the invention, there is provided a method for loading a substrate onto a support table for a lithographic apparatus, the support table comprising: a base surface; a plurality of burls protruding above the base surface, each of the plurality of burls having a respective burl distal end, the burl distal ends being arranged in a support plane so as to support the substrate; and at least one protrusion protruding above the base surface, each protrusion having a respective protrusion distal end, wherein the respective protrusion distal end is spaced a loaded substrate distance from the support plane; wherein each protrusion distal end is provided with a gas extraction opening configured to extract gas from a gap between the base surface and the substrate, wherein each gas extraction opening has a gas extraction opening diameter, wherein the loaded substrate distance is less than half the gas extraction opening diameter; wherein the method comprises: lowering the substrate towards the support table; and extracting gas from the gap through each gas extraction opening when the substrate is being lowered onto the support table.

According to an aspect of the invention, there is provided a method for loading a substrate onto a support table for a lithographic apparatus, the support table comprising: a base surface; a plurality of burls protruding above the base surface, each of the plurality of burls having a respective burl distal end, the burl distal ends being arranged in a support plane so as to support the substrate; a first group of at least one gas extraction opening connected to the gas extraction system; and a second group of at least one gas extraction opening connected to the gas extraction system; wherein the method comprises: lowering the substrate towards the support table; extracting gas from a gap between the base surface and the substrate through the first group and the second group when the distance between the substrate and the support plane is greater than a threshold distance such that gas is extracted from the gap at a first loading flow rate when the distance between the substrate and the support plane is greater than a threshold distance; and stopping extracting gas from the gap through the first group when the distance between the substrate and the support plane is less than the threshold distance such that gas is extracted from the gap at a second loading flow rate when the distance between the substrate and the support plane is less than the threshold distance, wherein the second loading flow rate is lower than the first loading flow rate.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 8 to 11 depict, in cross-section, examples of a substrate being loaded onto a support table;

DETAILED DESCRIPTION

Figure 1:
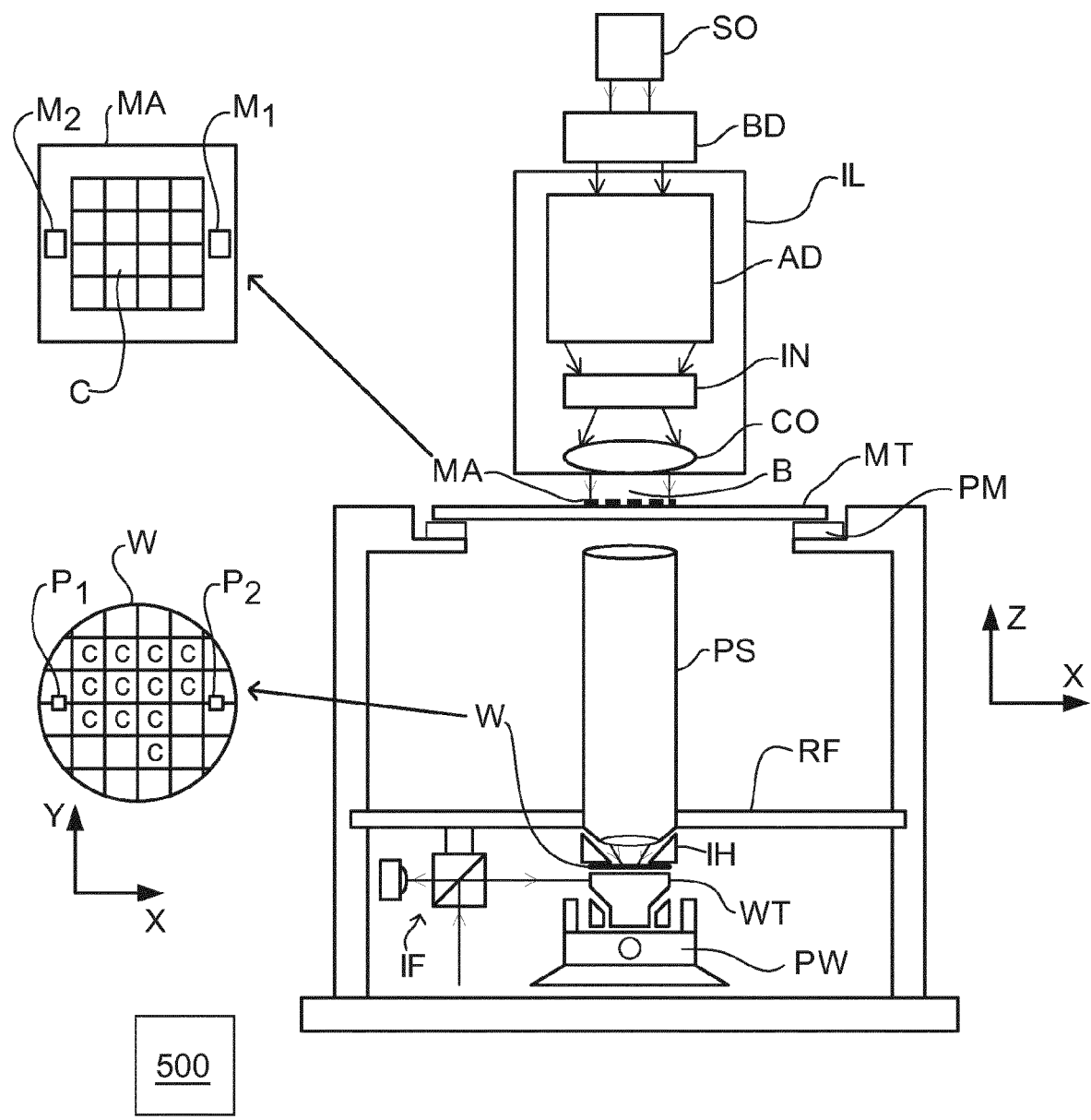
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device MA in accordance with certain parameters;

a support table, e.g. a sensor table to support one or more sensors or a support table WT constructed to hold a substrate (e.g. a resist-coated substrate) W, connected to a second positioner PW configured to accurately position the surface of the table, for example of a substrate W, in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA. It holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two or more tables (or stage or support), e.g., two or more support tables or a combination of one or more support tables and one or more cleaning, sensor or measurement tables. For example, in an embodiment, the lithographic apparatus is a multi-stage apparatus comprising two or more tables located at the exposure side of the projection system, each table comprising and/or holding one or more objects. In an embodiment, one or more of the tables may hold a radiation-sensitive substrate. In an embodiment, one or more of the tables may hold a sensor to measure radiation from the projection system.

In an embodiment, the multi-stage apparatus comprises a first table configured to hold a radiation-sensitive substrate (i.e., a support table) and a second table not configured to hold a radiation-sensitive substrate (referred to hereinafter generally, and without limitation, as a measurement, sensor and/or cleaning table). The second table may comprise and/or may hold one or more objects, other than a radiation-sensitive substrate. Such one or more objects may include one or more selected from the following: a sensor to measure radiation from the projection system, one or more alignment marks, and/or a cleaning device (to clean, e.g., the liquid confinement structure).

In such "multiple stage" (or "multi-stage") machines the multiple tables may be used in parallel, or preparatory steps may be carried out on one or more tables while one or more other tables are being used for exposure. The lithographic apparatus may have two or more patterning device tables (or stages or support) which may be used in parallel in a similar manner to substrate, cleaning, sensor and/or measurement tables.

Referring to FIG. 1, the illuminator IL receives a radiation beam from a radiation source SO. The source SO and the lithographic apparatus may be separate entities, for example when the source SO is an excimer laser. In such cases, the source SO is not considered to form part of the lithographic apparatus and the radiation beam is passed from the source SO to the illuminator IL with the aid of a beam delivery system BD comprising, for example, suitable directing mirrors and/or a beam expander. In other cases, the source SO may be an integral part of the lithographic apparatus, for example when the source SO is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator IL can be adjusted. In addition, the illuminator IL may comprise various other components, such as an integrator IN and a condenser CO. The illuminator IL may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the support table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the support table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions C (these are known as scribe-lane alignment marks). Similarly, in situations in which more than one die is provided on the patterning device MA, the patterning device alignment marks may be located between the dies.

Although specific reference may be made in this text to the use of lithographic apparatus in the manufacture of ICs, it should be understood that the lithographic apparatus described herein may have other applications in manufacturing components with microscale, or even nanoscale, features, such as the manufacture of integrated optical systems, guidance and detection patterns for magnetic domain memories, flat-panel displays, liquid-crystal displays (LCDs), thin-film magnetic heads, etc.

Arrangements for providing liquid between a final element of the projection system PS and the substrate can be classed into three general categories. These are the bath type arrangement, the so-called localized immersion system and the all-wet immersion system. In a bath type arrangement substantially the whole of the substrate W and optionally part of the support table WT is submersed in a bath of liquid.

Figure 2:
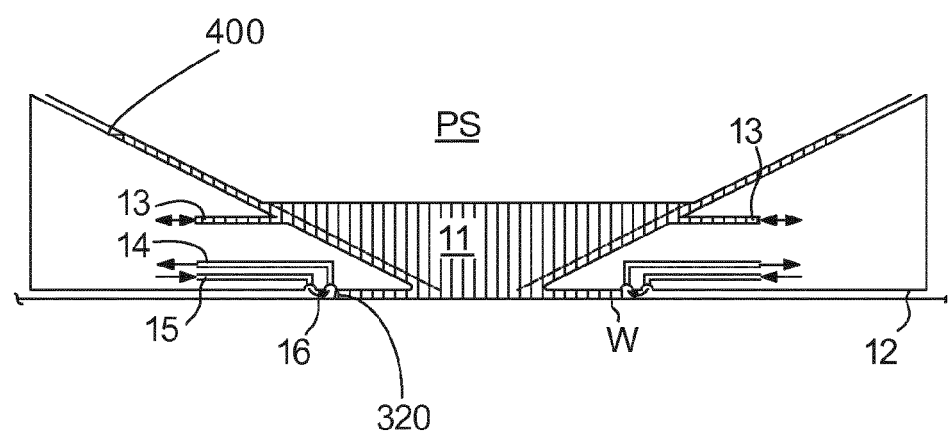
FIG. 2 depicts a liquid supply system for use in a lithographic projection apparatus.
Figure 3:
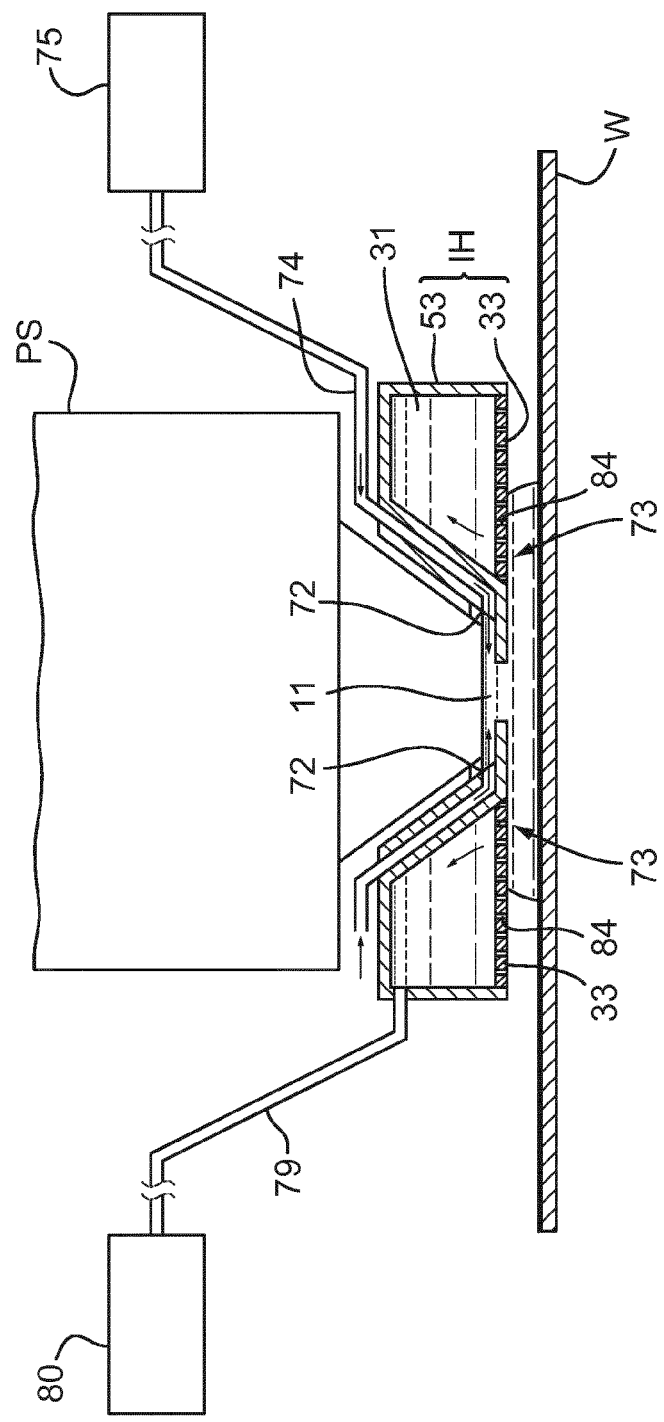
FIG. 3 is a side cross sectional view that depicts a further liquid supply system according to an embodiment.

A localized immersion system uses a liquid supply system in which liquid is only provided to a localized area of the substrate. The space filled by liquid is smaller in plan than the top surface of the substrate and the area filled with liquid remains substantially stationary relative to the projection system PS while the substrate W moves underneath that area. FIGS. 2 and 3 show different supply devices which can be used in such a system. A sealing feature is present to seal liquid to the localized area. One way which has been proposed to arrange for this is disclosed in PCT patent application publication no. WO 99/49504.

An arrangement which has been proposed is to provide the liquid supply system with a liquid confinement structure which extends along at least a part of a boundary of a space between the final element of the projection system and the support table. Such an arrangement is illustrated in FIG. 2.

FIG. 2 schematically depicts a localized liquid supply system or fluid handling system. The liquid supply system is provided with a fluid handling structure IH or liquid confinement structure, which extends along at least a part of a boundary of the space 11 between the final element of the projection system PS and the support table WT or substrate W. (Please note that reference in the following text to surface of the substrate W also refers in addition or in the alternative to a surface of the support table WT, unless expressly stated otherwise.) The fluid handling structure IH is substantially stationary relative to the projection system PS in the XY plane though there may be some relative movement in the Z direction (in the direction of the optical axis). In an embodiment, a seal is formed between the fluid handling structure IH and the surface of the substrate W and may be a contactless seal such as a gas seal (such a system with a gas seal is disclosed in European patent application publication no. EP-A-1,420,298) or liquid seal.

The fluid handling structure IH at least partly contains liquid in the space 11 between the final element of the projection system PS and the substrate W. A contactless seal 16 to the substrate W may be formed around the image field of the projection system PS so that liquid is confined within the space 11 between the substrate W surface and the final element of the projection system PS. The space 11 is at least partly formed by the fluid handling structure IH positioned below and surrounding the final element of the projection system PS. Liquid is brought into the space 11 below the projection system PS and within the fluid handling structure IH by one of liquid inlets 13. The liquid may be removed by another of liquid outlets 13. The liquid may be brought into the space 11 through at least two liquid inlets 13. Which of liquid openings 13 is used to supply the liquid and optionally which is used to remove the liquid may depend on the direction of motion of the support table WT. The fluid handling structure IH may extend a little above the final element of the projection system PS. The liquid level rises above the final element so that a buffer of liquid is provided. In an embodiment, the fluid handling structure IH has an inner periphery that at the upper end closely conforms to the shape of the projection system PS or the final element thereof and may, e.g., be round. At the bottom, the inner periphery closely conforms to the shape of the image field, e.g., rectangular, though this need not be the case.

The liquid may be contained in the space 11 by a gas seal 16 which, during use, is formed between the bottom of the fluid handling structure IH and the surface of the substrate W. The gas seal 16 is formed by gas. The gas in the gas seal 16 is provided under pressure via inlet 15 to the gap between the fluid handling structure IH and substrate W. The gas is extracted via outlet 14. The overpressure on the gas inlet 15, vacuum level on the outlet 14 and geometry of the gap are arranged so that there is a high-velocity gas flow inwardly that confines the liquid. The force of the gas on the liquid between the fluid handling structure IH and the substrate W contains the liquid in the space 11. The inlets/outlets may be annular grooves which surround the space 11. The annular grooves may be continuous or discontinuous. The flow of gas is effective to contain the liquid in the space 11. Such a system is disclosed in United States patent application publication no. US 2004-0207824, which is hereby incorporated by reference in its entirety. In an embodiment, the fluid handling structure IH does not have a gas seal.

FIG. 3 is a side cross sectional view that depicts a further liquid supply system or fluid handling system according to an embodiment. The arrangement illustrated in FIG. 3 and described below may be applied to the lithographic apparatus described above and illustrated in FIG. 1. The liquid supply system is provided with a fluid handling structure IH or a liquid confinement structure, which extends along at least a part of a boundary of the space 11 between the final element of the projection system PS and the support table WT or substrate W. (Please note that reference in the following text to surface of the substrate W also refers in addition or in the alternative to a surface of the support table WT, unless expressly stated otherwise.)

The fluid handling structure IH at least partly contains liquid in the space 11 between the final element of the projection system PS and the substrate W. The space 11 is at least partly formed by the fluid handling structure IH positioned below and surrounding the final element of the projection system PS. In an embodiment, the fluid handling structure IH comprises a main body member 53 and a porous member 33. The porous member 33 is plate shaped and has a plurality of holes (i.e., openings or pores). In an embodiment, the porous member 33 is a mesh plate wherein numerous small holes 84 are formed in a mesh. Such a system is disclosed in United States patent application publication no. US 2010/0045949 A1, which is hereby incorporated by reference in its entirety.

The main body member 53 comprises supply ports 72, which are capable of supplying the liquid to the space 11, and a recovery port 73, which is capable of recovering the liquid from the space 11. The supply ports 72 are connected to a liquid supply apparatus 75 via passageways 74. The liquid supply apparatus 75 is capable of supplying the liquid to the supply ports 72. The liquid that is fed from the liquid supply apparatus 75 is supplied to each of the supply ports 72 through the corresponding passageway 74. The supply ports 72 are disposed in the vicinity of the optical path at prescribed positions of the main body member 53 that face the optical path. The recovery port 73 is capable of recovering the liquid from the space 11. The recovery port 73 is connected to a liquid recovery apparatus 80 via a passageway 79. The liquid recovery apparatus 80 comprises a vacuum system and is capable of recovering the liquid by suctioning it via the recovery port 73. The liquid recovery apparatus 80 recovers the liquid LQ recovered via the recovery port 73 through the passageway 79. The porous member 33 is disposed in the recovery port 73.

In an embodiment, to form the space 11 with the liquid between the projection system PS and the fluid handling structure IH on one side and the substrate W on the other side, liquid is supplied from the supply ports 72 to the space 11 and the pressure in a recovery chamber 31 in the fluid handling structure IH is adjusted to a negative pressure so as to recover the liquid via the holes 84 (i.e., the recovery port 73) of the porous member 33. Performing the liquid supply operation using the supply ports 72 and the liquid recovery operation using the porous member 33 forms the space 11 between the projection system PS and the fluid handling structure IH on one side and the substrate W on the other side.

As depicted in the Figures, the apparatus may be of an immersion type. Alternatively, the apparatus may be of a dry type in which the substrate is not immersed in a liquid.

In an embodiment the support table WT comprises one or more holes formed therein. The holes facilitate clamping of the substrate W. Gas may be extracted through the holes from the region enclosed by the substrate W and the support table WT, thereby reducing the pressure in this region for clamping of the substrate W. Clamping a substrate W involves first loading the substrate W onto the support table WT and second reducing the pressure in the region enclosed by the substrate W and the support table WT for clamping of the substrate W.

It is possible for the substrate W to deform during loading. One way for the substrate W to be loaded is by supporting the substrate W from underneath by a plurality of pins 82 (e.g. see FIGS. 8 and 10) and lowering the substrate W onto the support table WT by lowering the pins 82. The pins 82 can extend through corresponding apertures in the support table WT. The substrate W can deform due to gravity when it is being lowered onto the support table WT. For example, the substrate W can bend over the pins 82 during lowering (e.g. see FIG. 8). This can lead to the substrate W being in a non-flat state when it touches the support table WT (e.g. see FIG. 9).

Figure 9:
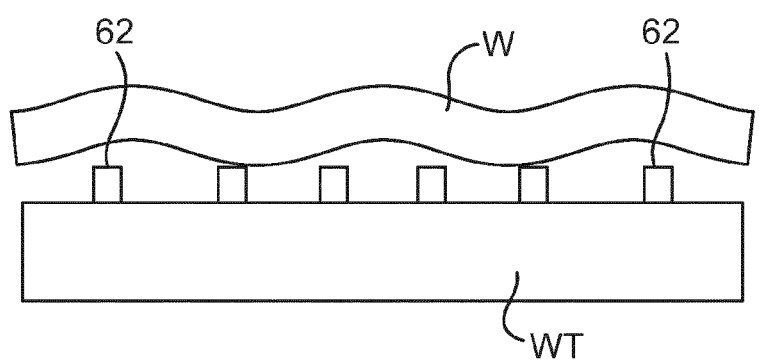

Gas is extracted through the holes from the region enclosed by the substrate W and the support table WT so as to clamp the substrate W. If the gas is extracted during loading of the substrate W, the substrate W can instantly stick to the support table WT in its deformed state, as shown in FIG. 9. This can cause in-plane deviations. The forces between the support table WT and the substrate W can be sufficient to cause the substrate W to slip relative to the support table WT. The magnitude of force at which the substrate W slips relative to the support table WT depends on the particular top surface of the support table WT and the particular bottom surface of the substrate W. This makes the clamping fingerprint dependent on both the support table WT and the substrate W. As a result, it is difficult to compensate for the clamping fingerprints.

If gas is not extracted during loading of the substrate W, then the substrate W can be allowed time to settle on the support table WT. This can reduce the deformation of the substrate W when it is clamped. However, this has a throughput impact. It takes longer for each substrate W to be clamped.

Figure 4:
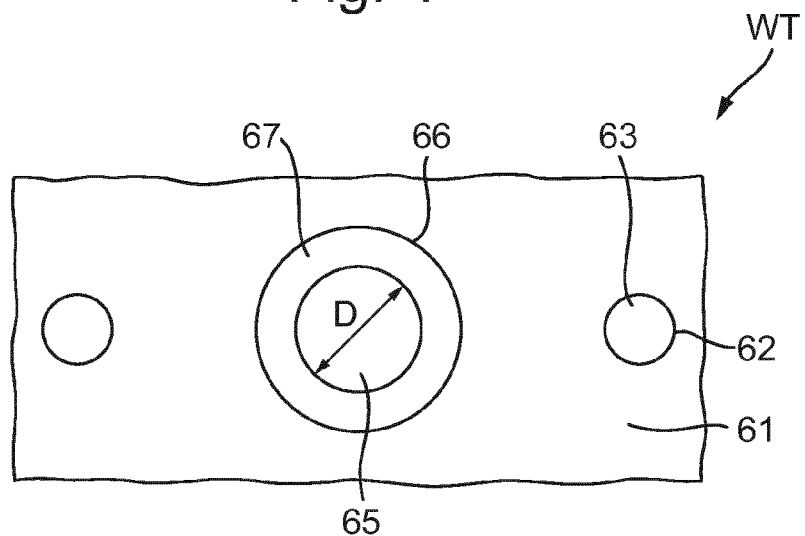
FIG. 4 depicts, in plan, a support table for a lithographic apparatus.

FIG. 4 depicts in plan view part of a support table WT for a lithographic apparatus according to an embodiment of the invention. The support table WT is configured to support a substrate W. The lithographic apparatus also comprises a gas extraction system that interacts with the support table WT.

The support table WT comprises a base surface 61. In an embodiment the base surface 61 is configured to be substantially parallel to a lower surface of the substrate W supported on the support table WT. The support table WT comprises a plurality of burls 62. The burls 62 protrude above the base surface 61. Each of the plurality of burls 62 has a respective burl distal end 63. The burl distal end 63 are arranged in a support plane 64 (e.g. see FIG. 5) so as to support the substrate W. When the substrate W is supported by the support table WT, the substrate W is supported by the respective distal end 63 of each of the plurality of the burls 62.

In use, the substrate W is supported by the support table WT. When the substrate W is supported by the support table WT, the substrate W is supported by the respective distal end 63 of each of the burls 62.

As depicted in FIG. 4, in an embodiment the support table WT comprises at least one gas extraction opening 65. The gas extraction opening 65 is connected to the gas extraction system. The gas extraction system is configured to extract gas from the gap between the base surface 61 and the substrate W through each gas extraction opening 65 when the substrate W is being lowered onto the support table WT.

Figure 5:
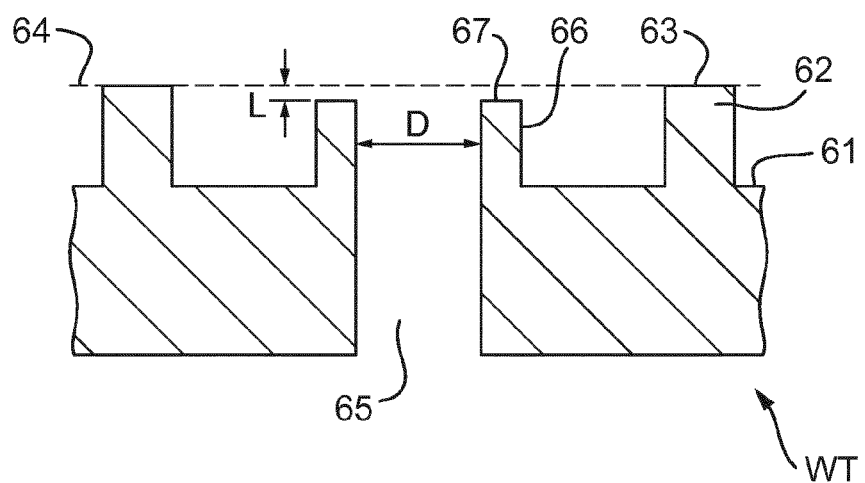
FIGS. 5 to 7 each depict, in cross-section, a support table according to an embodiment of the invention.
Figure 6:
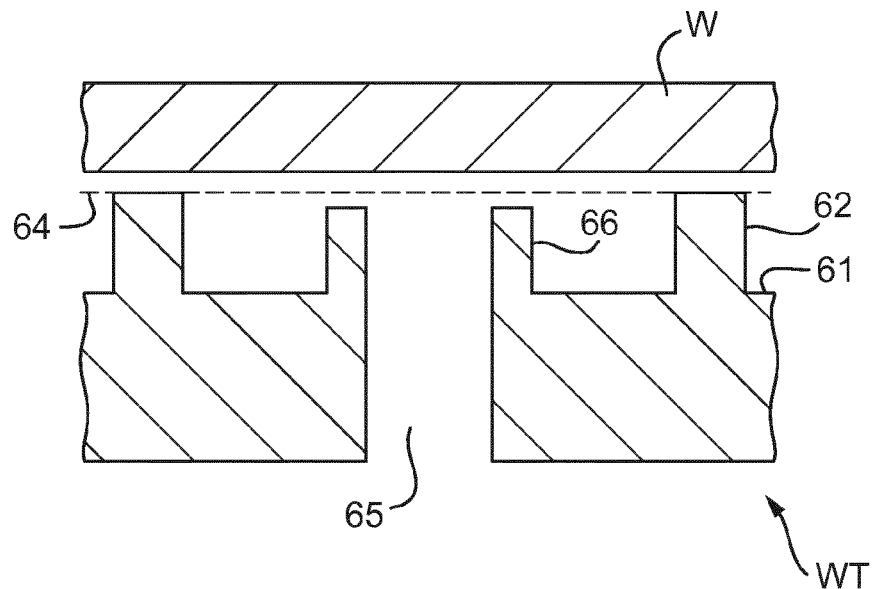

As depicted in FIG. 4, in an embodiment the support table WT comprises at least one protrusion 66. The protrusion 66 protrudes above the base surface 61. This is shown more clearly in FIG. 5 and FIG. 6. FIG. 5 depicts a cross-sectional view of the section of support table WT shown in FIG. 4 when a substrate W is being lowered onto the support table WT. FIG. 6 depicts a cross-sectional view at a later point in time (compared to FIG. 5) when the substrate W is close to the support table WT.

Each protrusion 66 has a respective protrusion distal end 67. The respective protrusion distal end 67 is spaced from the support plane 64. The shortest distance between the support plane 64 and the protrusion distal end 67 is a loaded substrate distance L, which is shown in FIG. 5. The protrusion distal end 67 is spaced the loaded substrate distance L from the support plane 64. The support plane 64 is the loaded substrate distance L above the protrusion distal end 67.

As depicted in FIGS. 4 to 6, the gas extraction opening 65 is provided in the protrusion distal end 67. The gas extraction opening 65 has a gas extraction opening diameter D, which is shown in FIG. 4.

As depicted in FIG. 4, in an embodiment the gas extraction opening 65 is substantially circular in plan view. However, this is not necessarily the case. The shape of the gas extraction opening 65 is not particularly limited. For example, in alternative embodiments, the gas extraction opening 65 can be square, rectangular or polygonal.

The protrusion 66 is provided around the gas extraction opening 65. The protrusion 66 may be called a pillar or a tube, for example. The gas extraction opening 65 may be called a pre-clamp hole. The protrusion 66 is configured to provide a restriction for gas flow through the gas extraction opening 65. The gas flow restriction provided by the protrusion 66 only becomes significant when the substrate W is sufficiently close to the support table WT. The protrusion 66 creates a dam around the gas extraction opening 65.

The distance between the burl distal ends 63 and the base surface 61 is not particularly limited. Merely as an example, in an embodiment the distance between the burl distal end 63 and the base surface 61 is in the range of from about 100 μm to about 200 μm, for example about 150 μm.

The gas extraction opening diameter D is not particularly limited. Merely as an example, in an embodiment the gas extraction opening diameter D is in the range of from about 200 μm to about 500 μm, for example about 400 μm.

FIG. 5 depicts the situation during loading of the substrate W when the substrate W is relatively far away from the support table WT. In the situation shown in FIG. 5, the dominant restriction to gas flow through the gas extraction opening 65 is the gas extraction opening diameter D. The gas extraction opening diameter D can be the limiting factor for the gas flow rate through the gas extraction opening 65.

FIG. 6 depicts the later situation when the substrate W has come close to the support table WT. In an embodiment the loaded substrate distance L is less than half the gas extraction opening diameter D. Accordingly, in the situation shown in FIG. 6, the gap between the substrate W and the protrusion distal ends 67 is the dominant restriction to gas flow through the gas extraction opening 65. When the substrate W approaches the support table WT, the flow rate of gas through the gas extraction opening 65 is reduced. In the situation shown in FIG. 6, the gas extraction opening diameter D is no longer the limiting factor for gas flow rate through the gas extraction opening 65. Instead, the gap between the substrate W and the protrusion distal end 67 is the limiting factor for the gas flow rate through the gas extraction opening 65. As a result, when the substrate W is sufficiently close to the support table WT, the gas flow rate through the gas extraction opening 65 is reduced. This reduces the rate of reduction in the pressure in the region between the substrate W and the support table WT. This allows the substrate W to settle on the support table WT. The substrate W can relax and slip relative to the support table WT. As a result, the deformation (e.g. due to gravity) of the substrate W during loading of the substrate W can be reduced by allowing the substrate W to settle and relax as it comes into contact with the support table WT.

The protrusions 66 act as a passive flow limiter. The effect of the protrusions 66 as a passive flow limiter depends on the distance between the substrate W and the support table WT. The presence of the protrusions 66 has relatively little effect when the substrate W is far from the support table WT. Accordingly, an embodiment of the present invention is expected to reduce the impact that allowing the substrate W to settle has on throughput. When the substrate W is sufficiently close to the support table WT, the protrusions 66 limit the flow through the gas extraction openings 65. Accordingly, an embodiment of the invention is expected to reduce the impact on overlay of extracting gas during loading of the substrate W.

In order for the protrusions 66 to act as a flow limiter, the loaded substrate distance L is less than half the gas extraction opening diameter D. If the loaded substrate distance L is more than half the gas extraction opening diameter D, then the protrusions 66 do not sufficiently restrict gas flow through the gas extraction openings 65 even when the substrate W is close to the support table WT.

An embodiment of the invention is expected to achieve improved overlay without the reduction in throughput that would otherwise be caused by a reduction in gas flow through the gas extraction openings 65.

By providing the support table WT with the protrusion 66, the flow rate of gas through the gas extraction opening 65 changes during loading of the substrate W. Gas is extracted from the gap between the base surface 61 and the substrate W at a first loading flow rate when the distance between the substrate W and the support plane 64 is greater than a threshold distance. This is the situation depicted in FIG. 5. Subsequently, gases extracted from the gap at a second loading flow rate when the distance between the substrate W and the support plane 64 is less than the threshold distance. The second loading flow rate is lower than the first loading flow rate. This is the situation shown in FIG. 6. The protrusion 66 allows the flow rate of gas extracted from the gap to be reduced from the first loading flow rate to the second loading flow rate during loading of the substrate W. The threshold distance is a distance at which the flow rate of gas from the gap between the substrate W and the support table WT is reduced. For example, in an embodiment the threshold distance corresponds to the distance at which the protrusions 66 become the limiting factor for the flow rate. The value of the threshold distance is not particularly limited. Merely as an example, in an embodiment the threshold distance is less than or equal to about 0.5 mm, or optionally less than or equal to about 0.2 mm. In an embodiment the threshold distance is greater than or equal to about 0.05 mm, or optionally greater than or equal to about 0.1 mm.

In an embodiment, the gas extraction system is configured such that the pressure at the underpressure source of the gas extraction system is substantially constant during gas extraction (i.e. during loading of the substrate W onto the support table WT). However, the flow rate of gas extracted from the gap between the substrate W and the support table WT varies based on the distance between the substrate W and the support table WT. This is because the protrusions 66 cause the flow rate to be reduced when the substrate W approaches the support table WT.

However, it is not necessary for the support table WT to be provided with the protrusion 66 in order for the flow rate to be reduced from the first loading flow rate to the second loading flow rate. Other mechanisms can alternatively be used to implement the first loading flow rate when the distance between the substrate W and the support plane 64 is greater than the threshold distance and to implement the second loading flow rate when the distance between the substrate W and the support plane 64 is less than the threshold distance.

Figure 16:
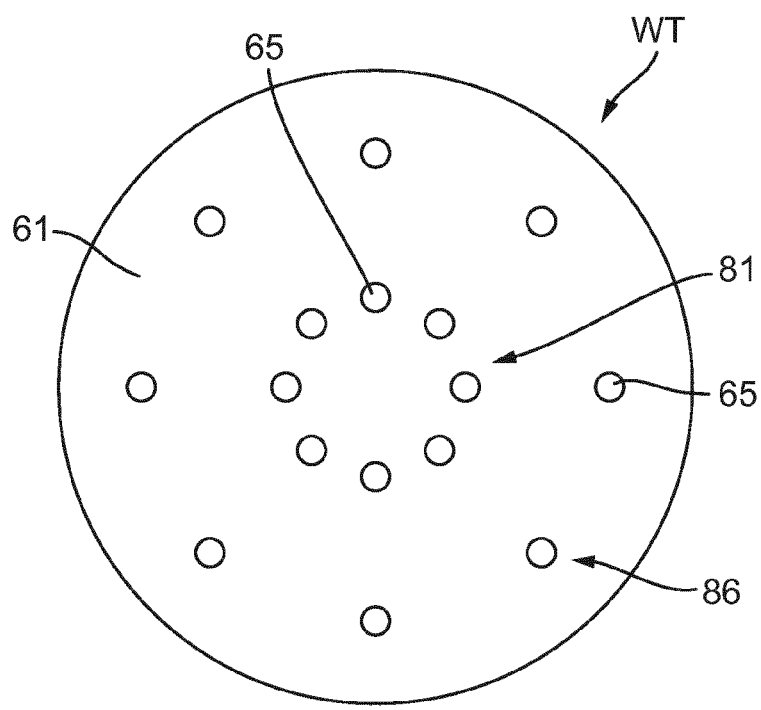

For example, as depicted in FIG. 16 in an embodiment the support table WT comprises two groups of gas extraction openings 65. The support table WT comprises a first group 81 of at least one gas extraction opening 65. The support table WT further comprises a second group 86 of at least one gas extraction opening 65.

The gas extraction system is configured to extract gas from the gap between the base surface 61 and the substrate W through the first group 81 and the second group 86 when the distance between the substrate W and the support plane 64 is greater than the threshold distance. Gas is extracted from the gap at a first loading flow rate when the distance between the substrate W and the support plane 64 is greater than the threshold distance. When the substrate W is sufficiently far from the support table WT, both the first group 81 and the second group 86 of gas extraction openings 65 are used to extract gas from the gap between the base surface 61 and the substrate W.

In an embodiment the gas extraction system is configured to stop extracting gas from the gap through the first group 81 when the distance between the substrate W and the support plane 64 is less than the threshold distance. Gas is extracted from the gap at a second loading flow rate when the distance between the substrate W and the support plane 64 is less than the threshold distance. The second loading flow rate is lower than the first loading flow rate. When the substrate W is sufficiently close to the support table WT, only the second group 86 is used to extract gas from the gap. The flow rate through the gas extraction openings 65 is reduced when the substrate W is close to the support table WT.

Accordingly, an embodiment of the present invention is expected to reduce the impact that allowing the substrate W to settle has on throughput. When the substrate W is sufficiently close to the support table WT, the flow rate through the gas extraction openings 65 is reduced. Accordingly, an embodiment of the invention is expected to reduce the impact on overlay of extracting gas during loading of the substrate W.

An embodiment of the invention is expected to achieve improved overlay without the reduction in throughput that would otherwise be caused by a permanent reduction in gas flow through the gas extraction openings 65.

In an embodiment, the first group 81 may be radially inward of the second group 86, as shown in FIG. 16. However, this is not necessarily the case. In an alternative embodiment, the first group 81 is radially outward of the second group 86. In a further alternative embodiment, the gas extraction openings 65 of the first group 81 are among the gas extraction openings 65 of the second group 86.

The provision of the first group 81 and the second group 86 of gas extraction openings 65 is presented as an alternative to the provision of the protrusions 65 to the support table WT. However, in an embodiment these features may be combined. For example, in an embodiment, the support table WT comprises a first group 81 of at least one gas extraction opening 65 provided in a protrusion distal end 67 of a protrusion 66. The support table WT may further comprise a second group 86 of at least one gas extraction opening 65 provided in the protrusion distal end 67 of a protrusion 66.

Figure 7:
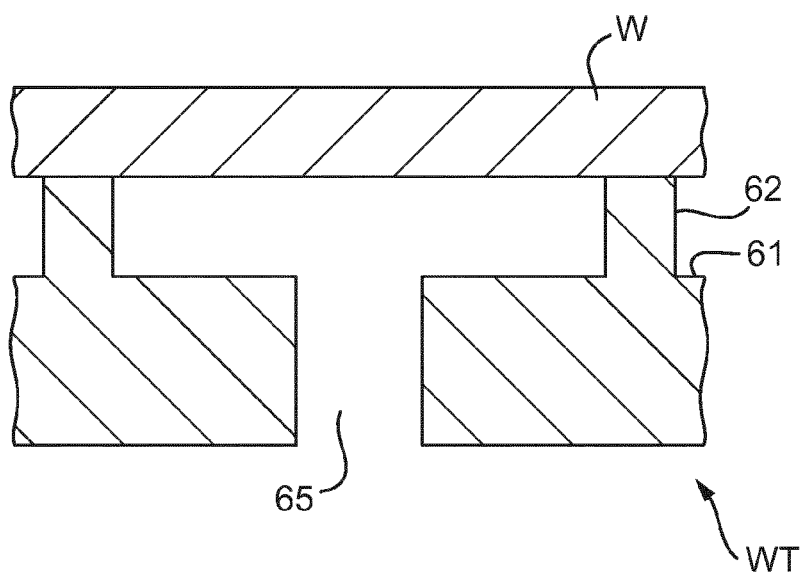

FIG. 7 depicts in cross-section part of a support table WT according to an embodiment of the invention. As shown in FIG. 7, the gas extraction opening 65 is not provided in any protrusion. The embodiment shown in FIG. 7 can be used in conjunction with the feature of providing the first group 81 and the second group 86 of gas extraction openings 65 described above. Accordingly, it is possible to reduce the impact on overlay of extracting gas during loading of the substrate W, without providing the protrusions. An embodiment of the invention is expected to achieve a reduction of the impact on overlay of extracting gas during loading of the substrate W, without making it more difficult to manufacture the support table WT. Additionally or alternatively, as described below, in an embodiment, gas extraction openings 65 that are not provided in protrusions may be combined with the provision of gas extraction openings 65 that are provided in protrusions 66.

Figure 8:
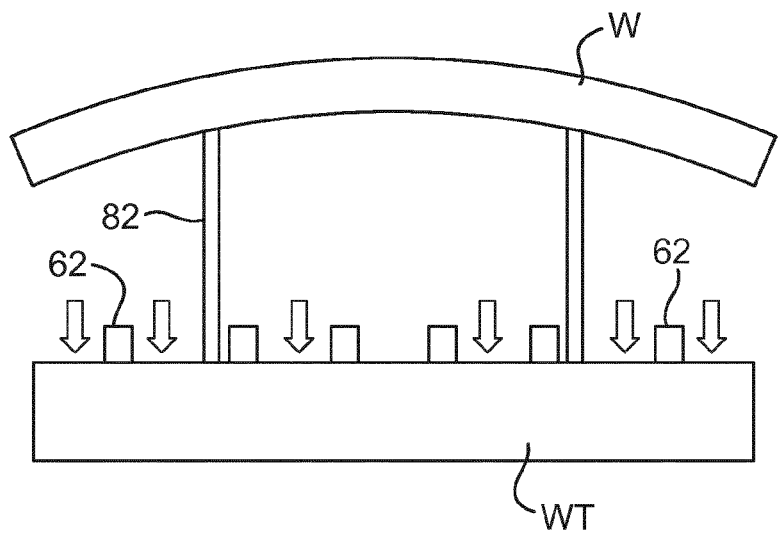

FIGS. 8 and 9 schematically depict a possible effect of extracting gas from the gap between the substrate W and the support table WT when the substrate W is being loaded onto the support table WT. As shown in FIG. 8, the substrate W can be supported by pins 82. The pins 82 are subsequently lowered through the support table WT so as to lower the substrate W onto the support table WT. FIG. 8 shows that the substrate W has bent over the pins 82 due to gravity.

FIG. 9 shows that the substrate W crumples when it is clamped to the support table WT. The substrate W crumples because it cannot relax after it has been lowered onto the support table WT.

In contrast, embodiments of the present invention are expected to achieve a reduction in deformation of the substrate W after it has been clamped onto the support table WT. This is because an embodiment of the invention allows the substrate W to settle or relax after it has come into contact with the support table WT. This is because when the substrate W is sufficiently close to the support table WT, the flow rate of gas extracted from the gap between the substrate W and the support table WT is greatly reduced.

FIGS. 10 and 11 depict the situation where no gas is extracted during loading of the substrate W onto the support table WT. As shown in FIG. 10, the substrate W relaxes on an air bearing, which is formed by the gas in the gap between the substrate W and the support table WT.

As shown in FIG. 11, when the substrate W comes into contact with the support table WT, the substrate W is allowed to relax and settle, thereby reducing deformation in the flatness of the substrate W. By allowing the substrate W to relax, the substrate W is flattened out. The substrate W can subsequently be clamped to the support table WT by extracting gas from the gap between the substrate W and the support table WT.

However, the situation shown in FIGS. 10 and 11 increases the time required for each substrate W to be clamped onto the support table WT. This reduces the throughput of the lithographic apparatus. In contrast, an embodiment of the invention is expected to achieve an increase in throughput relative to the situation shown in FIGS. 10 and 11. In particular, an embodiment of the present invention allows gas to be extracted from the gap while the substrate W is being lowered onto the support table WT. This reduces the time taken to reduce the pressure so that the substrate W can be clamped to the support table WT. An embodiment of the present invention allows the substrate W to be lowered onto the support table WT while as is extracted from the gap at a relatively high flow rate. This improves throughput compared to systems that involve having a reduced gas flow rate (even if the gas flow rate is not zero) from the gap during lowering of the substrate W.

If gas is extracted from the gap at a very low flow rate during lowering of the substrate W, this can place an undesirable limitation on how flat the substrate W has to be in order to be clamped. Some substrates W are not completely flat. For example, some substrates are warped and/or have a bowl shape. A bowl-shaped substrate has a higher leak flow during loading of the substrate W at the outer periphery of the substrate W. During clamping, this leak flow undesirably increases the pressure in the gap between the substrate W and the support table WT. At least to an extent, the leak flow counteracts the extraction of gas through the gas extraction openings 65.

If the leak flow rate is higher than the flow rate through the gas extraction openings 65, the substrate W cannot be clamped. This means that if the substrate W is warped too much, then the substrate W cannot be clamped.

In contrast, according to embodiments of the present invention, there is less of a limitation on how flat the substrate W has to be in order for it to be clamped. This is because the flow rate through the gas extraction opening 65 can be increased. This means that a higher level of warp of the substrate W is allowable while still allowing the substrate W to be clamped.

Figure 12:
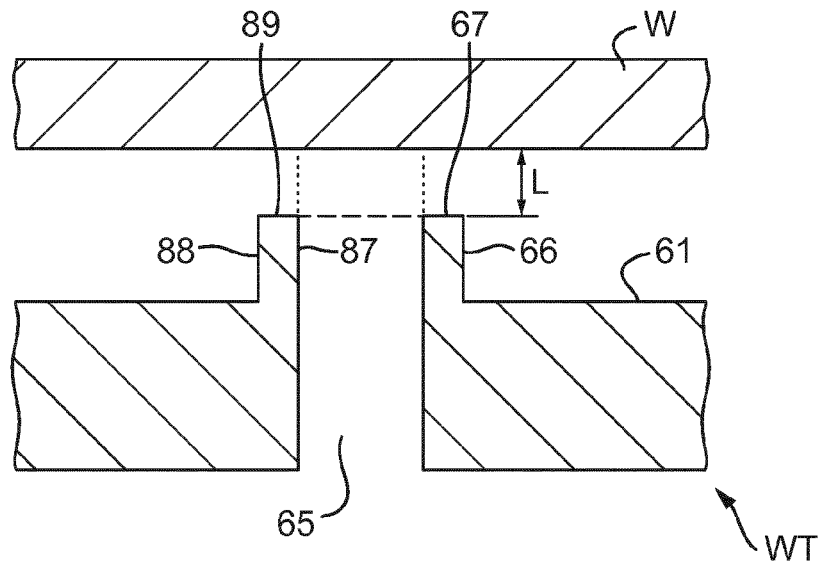
FIGS. 12 to 14 depict, in cross-section, details of a support table according to an embodiment of the invention.

As explained above, in an embodiment the support table WT is provided with at least one protrusion 66 and the loaded substrate distance L is less than one half of the gas extraction opening diameter D. In an embodiment the loaded substrate distance L is less than one quarter of the gas extraction opening diameter D. This means that when the substrate W is in contact with the support table WT, the area between the protrusion distal end 67 and the substrate W is less than the cross-sectional area of the gas extraction opening 65. FIG. 12 schematically shows the relevant cross-sectional area of the gas extraction opening 65, represented by a dashed line. Meanwhile, FIG. 12 also shows schematically the other relevant area between the protrusion distal end 67 and the substrate W. This is shown by two dotted lines. The area between the substrate W and the protrusion 66 can be calculate as being equal to $\pi DL$. Meanwhile, the cross-sectional area of the gas extraction opening 65 may be calculated as $\pi D2/4$.

In order to reduce the pressure between the substrate W and the support table WT, gas is extracted from the gap through the gas extraction opening 65. The gas passes through both of the areas represented in FIG. 12. By providing that the loaded substrate distance L is less than one quarter of the gas extraction opening diameter D, $\pi DL < \pi D2/4$. This means that the area between the protrusion 66 and the substrate W becomes the limiting factor when the substrate W is sufficiently close to the support table WT.

The absolute value of the loaded substrate distance L is not particularly limited. Merely as an example, in an embodiment the loaded substrate distance L is less than 300 µm.

By providing that the loaded substrate distance L is less than one quarter of the gas extraction opening diameter D, the second gas flow rate (when the substrate W is close to the support table WT) can be about 50% of the first loading flow rate (when the substrate W is far from the support table WT).

In an embodiment the loaded substrate distance L is less than or equal to about 1/10 of the gas extraction opening diameter D. In an embodiment the loaded substrate distance L is less than about 1/20 of the gas extraction opening diameter D. By providing that the loaded substrate distance L is less than about 1/20 of the gas extraction opening diameter D, the second loading flow rate (when the substrate W is close to the support table WT) can be about 10% of the first loading flow rate (when the substrate W is far from the support table WT).

Figure 13:
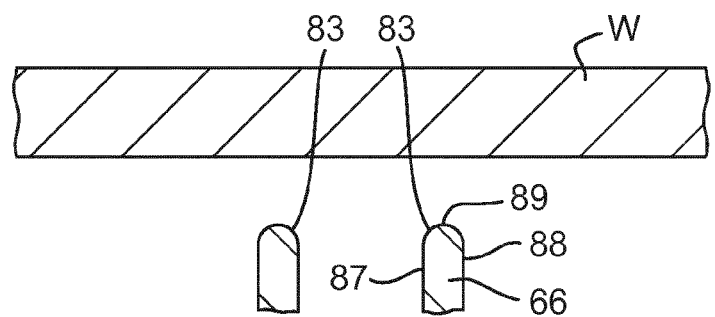

As depicted in FIG. 13, in an embodiment each protrusion 66 comprises an inner surface 87. The inner surface 87 defines the gas extraction opening 65. In an embodiment each protrusion 66 comprises an outer surface 88. The outer surface 88 is around the inner surface 87. In an embodiment each protrusion 66 comprises an upper surface 89. The upper surface 89 extends between the inner surface 87 and the outer surface 88. The upper surface 89 is at the protrusion distal end 67. In an embodiment the inner surface 87 is joined to the upper surface 89 at an inner edge 83.

As shown in FIG. 12, in an embodiment the upper surface 89 is configured to be substantially parallel to the support plane 64. However, this is not necessarily the case. For example, as shown in FIG. 13, in an embodiment the upper surface 89 is curved or angled.

Figure 14:
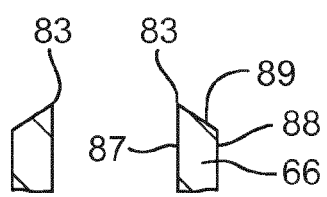

As depicted in FIG. 14, in an embodiment the upper surface 89 is configured to be slanted with respect to the support plane 64 in a downwards direction from the inner surface 87 to the outer surface 88.

In an embodiment the radius of curvature at the inner edge 83 is at most about 50 µm. By providing that the radius of curvature at the inner edge 83 is at most about 50 µm, the inner edge 83 represents the outer perimeter of the cross-sectional area of the gas extraction opening 65. Otherwise, if the radius of curvature at the inner edge 83 is larger, then the effective radius of the cross-sectional area of the gas extraction opening 65 is increased.

In an embodiment each protrusion 66 has a total width that is less than a pitch between the burls 62. In an embodiment the pitch between the burls 62 is in the region of from about 1.5 mm to about 2.5 mm. In an embodiment the total width of the protrusion 66 is less than about 2.5 mm, or less than about 1.5 mm. The total width of the protrusion 66 corresponds to the distance from the outer surface 88 at one side of the protrusion 66 to the outer surface 88 at the opposite side of the protrusion 66. The total width of the protrusion 66 corresponds to the sum of the gas extraction opening diameter D and the thickness of the protrusion 66 at both sides of the gas extraction opening 65.

Figure 15:
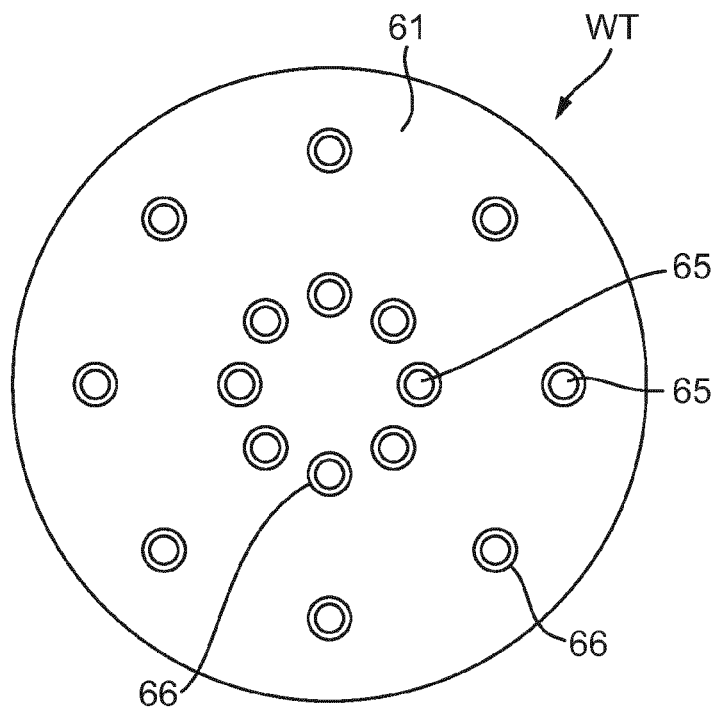
FIGS. 15 to 18 depict, in plan, support tables according to embodiments of the invention.

In an embodiment at least one of the protrusions 66 is positioned closer to the centre of the base surface 61 than to the peripheral edge of the base surface 61. In an embodiment at least one of the protrusions 66 is positioned closer to the peripheral edge of the base surface 61 and to the centre of the base surface 61. For example, an extra set of gas extraction openings 65 may be provided closer to the edge of the base surface 61, as shown in FIG. 15. FIG. 15 shows some gas extraction openings 65 closer to the centre of the base surface 61 and other gas extraction openings 65 closer to the peripheral edge of the base surface 61.

By providing gas extraction openings 65 closer to the peripheral edge of the base surface 61, an embodiment of the invention is expected to achieve clamping of substrates W that have a higher degree of warp. As described above, if a substrate W is sufficiently warped (e.g. a bowl shaped substrate W), it is possible that when the substrate W is close to the gas extraction openings 65 nearer the centre of the base surface 61, the leak flow at the peripheral edge of the substrate W is too high for the substrate W to be clamped. By providing extra gas extraction openings 65 towards the peripheral edge of the base surface 61, such a warped substrate W can be clamped. This is because even when the centre part of the substrate W is so close to the gas extraction openings 65 at the centre of the base surface that the gas flow through them is low, the peripheral edge of the substrate W is still far from the extra gas extraction openings 65. This means that the gas flow through the extra gas extraction opening 65 closer to the peripheral edge of the base surface 61 can be high enough to clamp the substrate W.

As shown in FIG. 15, each of the gas extraction openings 65 can be provided in a protrusion 66. However, this is not necessarily the case. In an embodiment, the gas extraction openings 65 are not provided with protrusions 66. In an alternative embodiment, the gas extraction openings 65 nearer to the centre of the base surface 61 are provided with protrusions 66, while the gas extraction openings 65 closer to the periphery of the base surface 61 are not provided with protrusions 66.

As explained above, in an embodiment the support table WT is provided with a first group 81 of gas extraction openings 65 and a second group 86 of gas extraction openings 65. The gas extraction system is configured to extract gas from the gap through the first group 81 at a first opening flow rate. The first opening flow rate corresponds to the total flow rate of gas through all of the gas extraction openings 65 in the first group 81 combined. The gas extraction system is configured to extract gas from the gap through the second group 86 at a second opening flow rate. The second opening flow rate is the total flow rate of gas through all of the gas extraction openings 65 in the second group 86 combined. In an embodiment the first opening flow rate is greater than the second opening flow rate.

In an embodiment the gas extraction channels for the first group 81 are connected to a different vacuum source from the gas extraction channels for the second group 86. As mentioned above, in an embodiment the gas extraction system is configured to stop extracting gas from the gap through the first group 81 when the distance between the substrate W and the support plane 64 is less than a threshold distance. By cutting off the flow through the first group 81 of gas extraction openings 65, the gas flow can be greatly reduced when the substrate W has landed on the support table WT. It is easier to completely stop extracting gas through a set of gas extraction openings 65 than to change the gas flow rate through each opening from a higher value to a lower value. An embodiment of the invention is expected to make it easier to manufacture a lithographic apparatus that comprises a gas extraction system and the support table WT.

Figure 17:
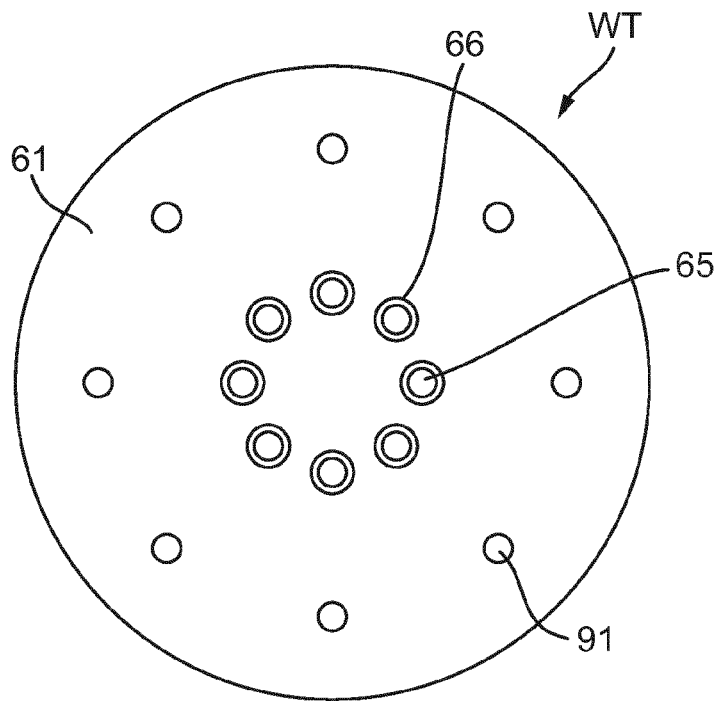

As shown in FIG. 17, in an embodiment the base surface 61 is provided with at least one clamping opening 91 connected to the gas extraction system. The gas extraction system is configured to extract gas from the gap through the at least one clamping opening 91 when the substrate W is supported by the support table WT. The clamping openings 91 are provided in the base surface 61. This means that the clamping openings are not surrounded by any protrusion 66. Accordingly, the gas flow rate through the clamping openings 91 is substantially unaffected by the distance between the substrate W and the support table WT.

It is possible that the presence of the protrusions 66 could reduce the clamping pressure applied when the substrate W is supported by the support table WT. By providing clamping openings 91 in the base surface 61, it can be ensured that the clamping pressure can be high when the substrate W is supported by the support table WT.

Figure 18:
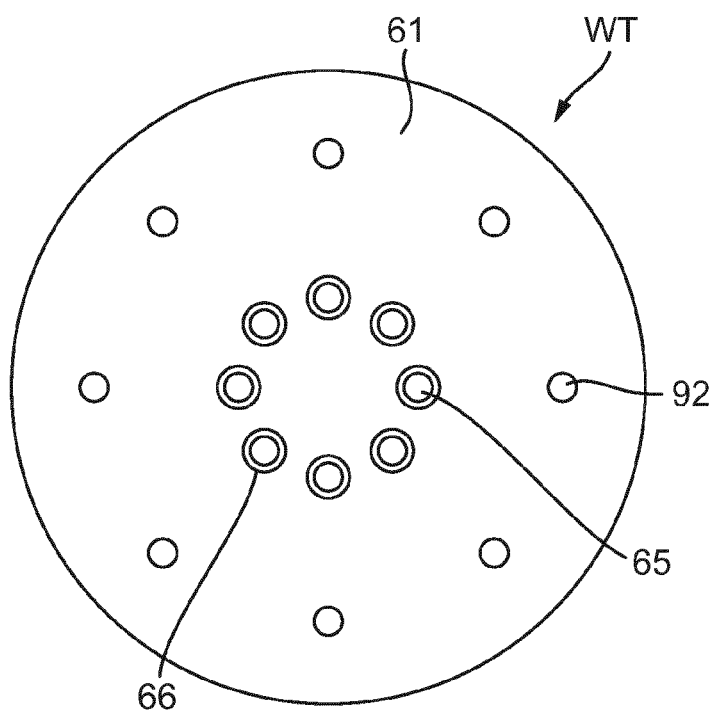

As shown in FIG. 18, in an embodiment the support table WT is provided with at least one gas supply opening 92, and a gas supply system configured to supply gas to the gap through the at least one gas supply opening 92 when the substrate W is being raised away from the support table. The gas supply system helps to unload the substrate W after an exposure process has finished. In an embodiment each gas supply opening 92 is separate from each gas extraction opening 65. This means that it is not necessary to design the lithographic apparatus in such a way that gas can flow in two directions through each gas channel. Instead, some openings are for the exclusive use of gas extraction. These are the gas extraction openings 65. Meanwhile, other openings can be used exclusively for the supply of gas, for example during unloading of the substrate W. An embodiment of the invention is expected to make it easier to manufacture the lithographic apparatus.

In an embodiment the lithographic apparatus comprises a controller 500 configured to control the gas extraction system. The controller 500 can implement the changes in gas flow rates described above. For example, in an embodiment the controller 500 is configured to control the gas extraction system to stop extracting gas from the gap through the first group 81 when the distance between the substrate W and the support plane 64 is less than the threshold distance.

Figure 19:
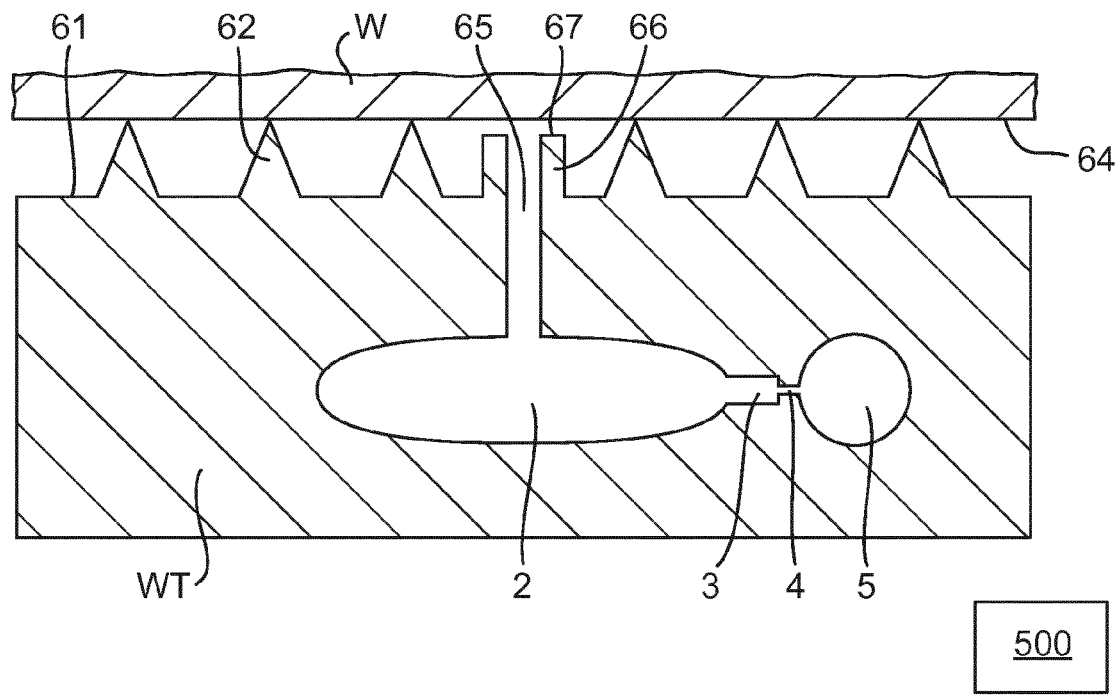
FIG. 19 schematically depicts in cross-section a support table of a lithographic apparatus according to an embodiment of the invention.

FIG. 19 depicts in cross-section a support table WT according to an embodiment of the invention. The features shown in FIG. 19 can be combined with any of the embodiments above. The description below relates primarily to an embodiment that has the protrusions 66 protruding above the base surface 61. However, the features described below relating to the buffer volume 2 can be applied to an embodiment that does not have the protrusions 66.

Figure 23:
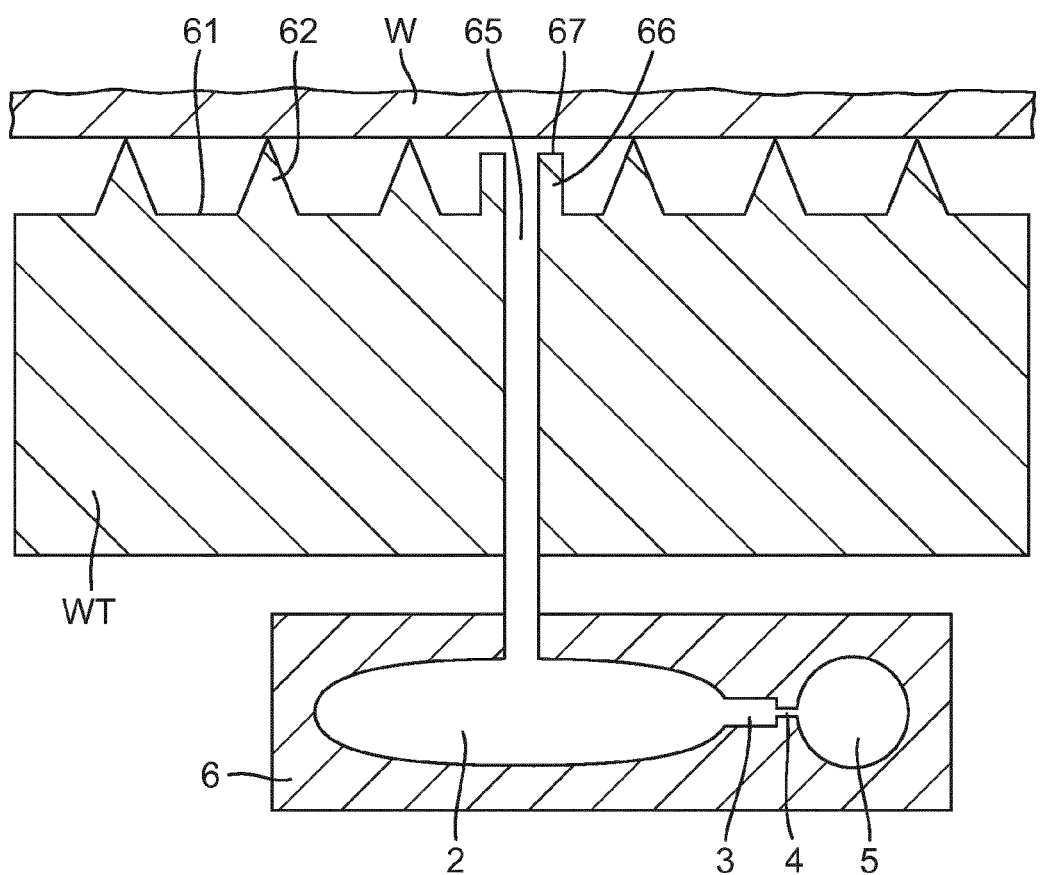
FIG. 23 schematically depicts in cross-section a support table according to an embodiment of the invention.

The protrusion distal end 67 is provided with a gas extraction opening 65 connected to the gas extraction system. In an embodiment the gas extraction system comprises a buffer volume 2. As depicted in FIG. 19, in an embodiment the buffer volume 2 is formed as a chamber housed within the support table WT. However, this is not necessarily the case. For example, in the alternative embodiment shown in FIG. 23, the buffer volume 2 is formed as a separate component separate from the support table WT.

The buffer volume 2 is in fluid communication with the gas extraction opening 65. As explained above, the distance between the support plane 64 (where the bottom surface of the substrate W coincidences when supported by the support table WT) and the protrusion distal end 67 is known as the loaded substrate distance L (shown in FIG. 5, for example). Each gas extraction opening 65 has a diameter known as the gas extraction opening diameter D. The loaded substrate distance L is less than half the gas extraction opening diameter D. In an embodiment the loaded substrate distance L is less than a quarter of the gas extraction opening diameter D.

As a result, the flow rate of gas extracted from the gap between the base surface 61 and the substrate W through the gas extraction opening 65 into the buffer volume 2 is reduced when the substrate W touches down onto the support table WT. This is because the gap between the protrusion distal end 67 and the substrate W becomes the limiting factor for the flow rate of gas into the buffer volume 2 through the gas extraction opening 65.

In an alternative embodiment, the support table WT does not comprise the protrusions 66. In such an embodiment, the height of the burls 62 may be sufficiently low that when the substrate W touches down onto the support table WT, the small distance between the base surface 61 and the substrate W becomes the limiting factor for the flow rate from the gap into the buffer volume 2. Whether or not the protrusions 66 are provided, the support table WT is sized and arranged such that the flow rate of gas extracted from the gap between the base surface 61 and the substrate W into the buffer volume 2 reduces when the substrate W touches down onto the support table WT.

In an embodiment the gas extraction system comprises an underpressure source 5. The underpressure source 5 is in fluid communication with the buffer volume 2. The underpressure source 5 is configured to extract gas from the buffer volume 2 at a substantially constant rate before and after the substrate W touches down onto the support table WT.

The pressure at the underpressure source 5 is controlled. For example, in an embodiment the controller 500 is configured to control the pressure at the underpressure source 5. In an embodiment the pressure at the underpressure source 5 is at least 20 kPa (absolute pressure). In an embodiment the pressure at the underpressure source 5 is at most 50 kPa. Merely as an example, the pressure at the underpressure source 5 may be about 40 kPa, which is about 60 kPa below the ambient pressure, which is atmospheric pressure.

In an embodiment the underpressure source 5 is configured to extract gas from the buffer volume 2 via a choked flow. As shown in FIG. 19, in an embodiment the gas extraction system comprises an orifice restriction 4 between the buffer volume 2 and the underpressure source 5. It is possible to provide a choked flow over the orifice restriction 4. In particular, if the pressure in the channel 3 on one side of the orifice restriction 4 is at least 1.92 times greater than the pressure in the underpressure source 5, then there is a choked flow from the buffer volume 2 to the underpressure source 5.

With the example in which the pressure at the underpressure source 5 is 40 kPa, then if the pressure in the channel 3 adjacent to the orifice restriction 4 above 77 kPa, then the flow rate through the orifice restriction 4 is the same as if the pressure in the channel 3 were 77 kPa. When the pressure in the channel 3 adjacent to the orifice restriction 4 is between atmospheric pressure and 77 kPa, the flow rate of the gas across the orifice restriction 4 is substantially the same.

Figure 20:
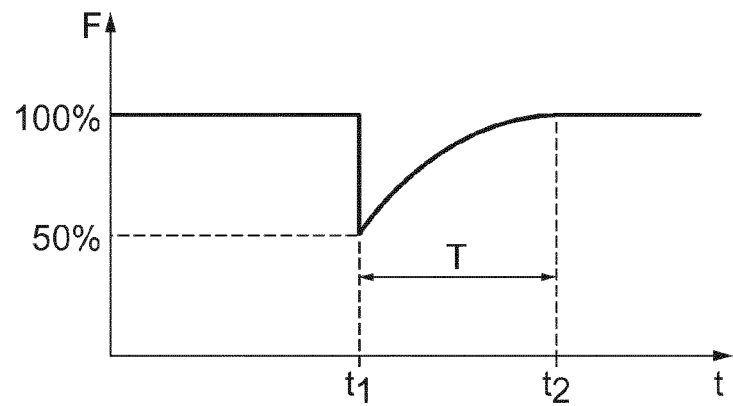
FIG. 20 is a graph showing the relationship between time during loading of a substrate and the flow rate of gas from the gap between the substrate and the base surface of the support table.

FIG. 20 shows the relationship between time during loading of the substrate W and the flow rate F of gas into the buffer volume 2. In FIG. 20, the X axis represents the time during loading of the substrate W. The Y axis represents the flow rate of the gas into the buffer volume 2. The time $t_1$ corresponds to the time at which the substrate W touches down onto the support table WT. The flow rate on the Y axis is shown as a percentage relative to the flow rate before the substrate W touches down onto the substrate W. As shown in FIG. 20, when the substrate W touches down onto the support table WT, the flow rate is reduced. This is because the gap between the protrusion distal end 67 and the substrate W becomes the limiting factor for the flow rate. FIG. 20 shows an example in which the flow rate is reduced from 100% to 50% when the substrate W touches down onto the support table WT.

Figure 21:
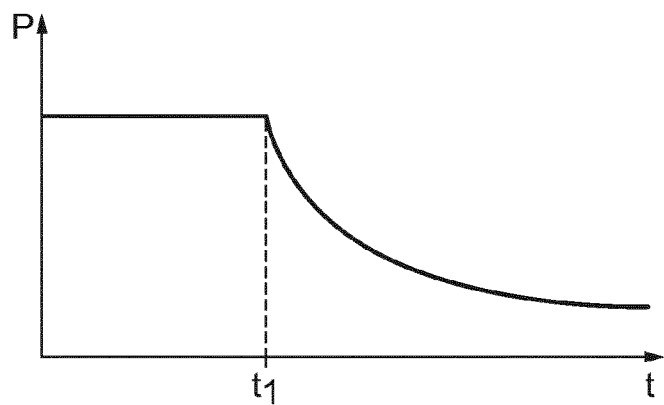
FIG. 21 is a graph showing the relationship between time during loading of the substrate and pressure in a buffer volume according to an embodiment of the invention.

FIG. 21 shows the relationship between time during the loading of the substrate W and the pressure P in the buffer volume 2. The Y axis represents the pressure in the buffer volume 2. As shown in FIG. 21, when the substrate W touches down onto the support table WT, the pressure starts to reduce. This is because the flow rate into the buffer volume 2 is reduced (as shown in FIG. 20), while the flow rate out from the buffer volume 2 remains substantially constant. The amount of gas in the buffer volume 2 reduces, thereby reducing the pressure in the buffer volume 2.

As the pressure in the buffer volume 2 decreases, the pressure differential between the buffer volume 2 and the gap between the substrate W and the base surface 61 of the support table WT increases. As a result of the increase in the pressure difference, the flow rate of gas into the buffer volume 2 begins to increase. This is shown in FIG. 20, where the flow rate increases after the initial drop from 100% flow rate to 50% flow rate.

In turn, as the flow rate of gas into the buffer volume 2 increases, the rate of reduction of the pressure in the buffer volume 2 decreases. This is shown in FIG. 21 by the flattening out of the curve of the decreasing pressure over time. In turn, the rate of increase of the flow rate into the buffer volume 2 decreases over time as shown by the flattening out of the curve in FIG. 20.

After an amount of time, the flow rate of gas into the buffer volume 2 reaches a steady state value. Similarly, the pressure in the buffer volume 2 reaches a steady state. As shown in FIG. 20, at time t2, the flow rate has increased to be substantially the same as before the substrate W touched down onto the support table WT. This means that in this embodiment the steady state value for the flow rate is substantially equal to the flow rate before the substrate W touches down onto the support table WT.

Figure 22:
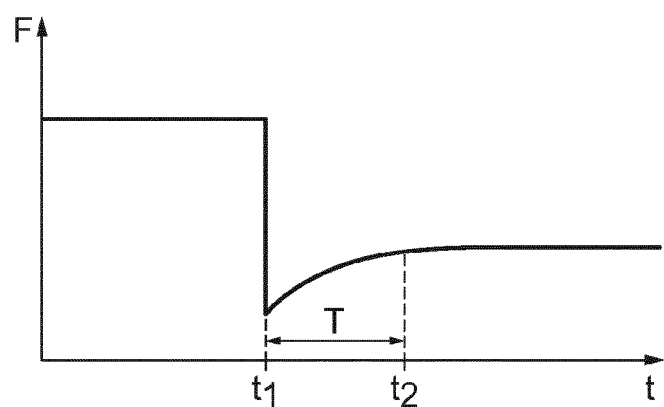
FIG. 22 is a graph showing the relationship between time during loading of a substrate and the flow rate of gas into the buffer volume according to an embodiment of the invention.

According to an embodiment of the invention, the flow rate is decreased temporarily before it increases back up to a steady state value. In the example shown in FIG. 20, the steady state value is the same as the flow rate of gas into the buffer volume 2 before the substrate W touched down onto the support table WT. However, this is not necessarily the case. As shown in FIG. 22, the steady state flow rate may be less than the flow rate before the substrate W touched down onto the support table WT.

In FIG. 20, the time period T represents the amount of time taken for the flow rate to return to a steady state value. In an embodiment the gas extraction system is configured such that after the flow rate of gas into the buffer volume 2 is initially reduced when the substrate W touches down onto the support table WT, it takes at least 5 ms, optionally at least 10 ms and optionally at least 20 ms for the flow rate of gas into the buffer volume 2 to return to a steady state value. 5 ms or 10 ms or 20 ms may be approximately the amount of time required for the substrate W to be clamped onto the support table WT. It is desirable for the flow rate to be reduced when the substrate W is in the process of being clamped onto the support table WT. This reduces the deviation between the position in which the substrate W is actually clamped from the target position of clamping the substrate W.

By providing the protrusions 66 together with the buffer volume 2, the flow rate of gas from under the substrate W is generally high, but is low when it is needed to be low. An embodiment of the invention is expected to achieve high throughput, while reducing the positional deviation of the clamped substrate W.

In an embodiment the gas extraction system is configured such that after the flow rate of gas into the buffer volume 2 is initially reduced when the substrate W touches down onto the support table WT, it takes at least 50 ms, or at least 100 ms for the flow rate of the gas into the buffer volume 2 to return to a steady state value.

As depicted in FIG. 20, in an embodiment the steady state value is substantially equal to the flow rate before the substrate W touches down onto the support table WT. A high steady state value is desirable for clamping substrates W that are warped.

According to an embodiment of the invention, only one extraction channel is needed for both loading of the substrate W and clamping of the substrate W. An embodiment of the invention is expected to make it cheaper to manufacture the support table WT.

As depicted in FIG. 22, in an embodiment the steady state flow is less than the flow rate before the substrate W touches down onto the support table WT. This is useful when there is no problem with having a lower flow than started with. This provides a robust way of designing the protrusions 66. In an embodiment, a second extraction channel without the protrusions 66 is provided to detect the presence of the substrate W and then to supply the higher flow needed for clamping substrates W that are warped.

As depicted in FIG. 19, in an embodiment a channel 3 is provided between the buffer volume 2 and the orifice restriction 4. However, the channel 3 is not essential. In an embodiment the channel 3 is not provided and the orifice restriction 4 is provided adjacent to (i.e. at one end of) the buffer volume 2. The flow of gas through the channel 3 may be laminar if the channel 3 is part of a long tube. There may be turbulent flow in the channel 3 where there are connections between different pieces of tubing.

In an embodiment a buffer volume 2 is provided as a single chamber. In an embodiment the buffer volume 2 is defined by tubing, for example particularly wide tubing. In an embodiment the buffer volume 2 has a volume of at least 2 ml, optionally at least 5 ml, optionally at least 10 ml, optionally at least 20 ml, optionally at least 50 ml and optionally at least 100 ml. The buffer volume 2 is positioned between the gas extraction opening 65 and the underpressure source 5. In an embodiment the buffer volume 20 is attached to all of the gas extraction openings 65. In an alternative embodiment there is a plurality of buffer volumes 2, each connected to one or more gas extraction openings 65.

In an embodiment, there is provided a lithographic apparatus comprising: a support table configured to support a substrate; and a gas extraction system; wherein the support table comprises: a base surface; a plurality of burls protruding above the base surface, each of the plurality of burls having a respective burl distal end, the burl distal ends being arranged in a support plane so as to support the substrate; and at least one gas extraction opening connected to the gas extraction system; wherein the gas extraction system is configured to extract gas from a gap between the base surface and the substrate through each gas extraction opening when the substrate is being lowered onto the support table; wherein the lithographic apparatus is configured such that gas is extracted from the gap at a first loading flow rate when the distance between the substrate and the support plane is greater than a threshold distance and gas is extracted from the gap at a second loading flow rate when the distance between the substrate and the support plane is less than the threshold distance, wherein the second loading flow rate is lower than the first loading flow rate.

In an embodiment, the support table comprises: at least one protrusion protruding above the base surface, each protrusion having a respective protrusion distal end, wherein the respective protrusion distal end is spaced a loaded substrate distance from the support plane; wherein each protrusion distal end is provided with a gas extraction opening of the at least one gas extraction opening, the gas extraction opening having a gas extraction opening diameter, wherein the loaded substrate distance is less than half the gas extraction opening diameter.

In an embodiment, there is provided a lithographic apparatus comprising: a support table configured to support a substrate; and a gas extraction system; wherein the support table comprises: a base surface; a plurality of burls protruding above the base surface, each of the plurality of burls having a respective burl distal end, the burl distal ends being arranged in a support plane so as to support the substrate; and at least one protrusion protruding above the base surface, each protrusion having a respective protrusion distal end, wherein the respective protrusion distal end is spaced a loaded substrate distance from the support plane; wherein each protrusion distal end is provided with a gas extraction opening connected to the gas extraction system, wherein each gas extraction opening has a gas extraction opening diameter, wherein the loaded substrate distance is less than half the gas extraction opening diameter; and wherein the gas extraction system is configured to extract gas from a gap between the base surface and the substrate through each gas extraction opening when the substrate is being lowered onto the support table.

In an embodiment, the loaded substrate distance is less than one quarter of the gas extraction opening diameter. In an embodiment, the gas extraction system comprises: a buffer volume in fluid communication with the gas extraction opening, wherein the support table is sized and arranged such that a flow rate of gas extracted from the gap between the base surface and the substrate through the gas extraction opening into the buffer volume reduces when the substrate touches down onto the support table; and an underpressure source in fluid communication with the buffer volume and configured to extract gas from the buffer volume at a substantially constant rate before and after the substrate touches down onto the support table. In an embodiment, the underpressure source is configured to extract gas from the buffer volume via a choked flow. In an embodiment, the gas extraction system is configured such that after the flow rate of gas into the buffer volume is initially reduced when the substrate touches down onto the support table, it takes at least 20 ms for the flow rate of gas into the buffer volume to return to a steady state value. In an embodiment, the at least one gas extraction opening comprises a first group of the at least one gas extraction opening and a second group of the at least one gas extraction opening, wherein the gas extraction system is configured to stop extracting gas from the gap through the first group when the distance between the substrate and the support plane is less than the threshold distance.

In an embodiment, there is provided a lithographic apparatus comprising: a support table configured to support a substrate; and a gas extraction system; wherein the support table comprises: a base surface; a plurality of burls protruding above the base surface, each of the plurality of burls having a respective burl distal end, the burl distal ends being arranged in a support plane so as to support the substrate; a first group of at least one gas extraction opening connected to the gas extraction system; and a second group of at least one gas extraction opening connected to the gas extraction system; and wherein the gas extraction system is configured to extract gas from a gap between the base surface and the substrate through the first group and the second group when the distance between the substrate and the support plane is greater than a threshold distance such that gas is extracted from the gap at a first loading flow rate when the distance between the substrate and the support plane is greater than a threshold distance; wherein the gas extraction system is configured to stop extracting gas from the gap through the first group when the distance between the substrate and the support plane is less than the threshold distance such that gas is extracted from the gap at a second loading flow rate when the distance between the substrate and the support plane is less than the threshold distance, wherein the second loading flow rate is lower than the first loading flow rate.

In an embodiment, the gas extraction system is configured to extract gas from the gap through the first group at a first opening flow rate, and to extract gas from the gap through the second group at a second opening flow rate, wherein the first opening flow rate is greater than the second opening flow rate. In an embodiment, the support table is provided with at least one gas supply opening; and a gas supply system configured to supply gas to the gap through the at least one gas supply opening when the substrate is being raised away from the support table, wherein each gas supply opening is separate from each gas extraction opening.

In an embodiment, there is provided a method for loading a substrate onto a support table for a lithographic apparatus, the support table comprising: a base surface; a plurality of burls protruding above the base surface, each of the plurality of burls having a respective burl distal end, the burl distal ends being arranged in a support plane so as to support the substrate; and at least one gas extraction opening configured to extract gas from a gap between the base surface and the substrate when the substrate is being lowered onto the support table; wherein the method comprises: lowering the substrate towards the support table; extracting gas from the gap at a first loading flow rate when the distance between the substrate and the support plane is greater than a threshold distance; and extracting gas from the gap at a second loading flow rate when the distance between the substrate and the support plane is less than the threshold distance, wherein the second loading flow rate is lower than the first loading flow rate.

In an embodiment, there is provided a method for loading a substrate onto a support table for a lithographic apparatus, the support table comprising: a base surface; a plurality of burls protruding above the base surface, each of the plurality of burls having a respective burl distal end, the burl distal ends being arranged in a support plane so as to support the substrate; and at least one protrusion protruding above the base surface, each protrusion having a respective protrusion distal end, wherein the respective protrusion distal end is spaced a loaded substrate distance from the support plane; wherein each protrusion distal end is provided with a gas extraction opening configured to extract gas from a gap between the base surface and the substrate, wherein each gas extraction opening has a gas extraction opening diameter, wherein the loaded substrate distance is less than half the gas extraction opening diameter; wherein the method comprises: lowering the substrate towards the support table; and extracting gas from the gap through each gas extraction opening when the substrate is being lowered onto the support table.

In an embodiment, a flow rate of gas extracted from the gap between the base surface and the substrate through the gas extraction opening into a buffer volume reduces when the substrate touches down onto the support table; and gas is extracted from the buffer volume at a substantially constant rate before and after the substrate touches down onto the support table.

In an embodiment, there is provided a method for loading a substrate onto a support table for a lithographic apparatus, the support table comprising: a base surface; a plurality of burls protruding above the base surface, each of the plurality of burls having a respective burl distal end, the burl distal ends being arranged in a support plane so as to support the substrate; a first group of at least one gas extraction opening connected to the gas extraction system; and a second group of at least one gas extraction opening connected to the gas extraction system; wherein the method comprises: lowering the substrate towards the support table; extracting gas from a gap between the base surface and the substrate through the first group and the second group when the distance between the substrate and the support plane is greater than a threshold distance such that gas is extracted from the gap at a first loading flow rate when the distance between the substrate and the support plane is greater than a threshold distance; and stopping extracting gas from the gap through the first group when the distance between the substrate and the support plane is less than the threshold distance such that gas is extracted from the gap at a second loading flow rate when the distance between the substrate and the support plane is less than the threshold distance, wherein the second loading flow rate is lower than the first loading flow rate.

Many of the examples above have been described in the context of an immersion lithographic apparatus. However, embodiments of the invention are equally applicable to a dry lithographic apparatus. As will be appreciated, any of the above-described features can be used with any other feature and it is not only those combinations explicitly described which are covered in this application.

As will be appreciated, any of the above described features can be used with any other feature and it is not only those combinations explicitly described which are covered in this application. For example, an embodiment of the invention could be applied to the embodiment of FIG. 3. Furthermore, although embodiments of the invention have been described above in the context of an immersion lithographic apparatus for convenience, it will be appreciated that an embodiment of the invention may be used in conjunction with any form of lithographic apparatus.

The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm). The term "lens", where the context allows, may refer to any one or combination of various types of optical components, including refractive and reflective optical components.

While specific embodiments of the invention have been described above, it will be appreciated that the invention may be practiced otherwise than as described. The descriptions above are intended to be illustrative, not limiting. Thus, it will be apparent to one skilled in the art that modifications may be made to the invention as described without departing from the scope of the claims set out below.

The invention claimed is:

1. A table for a physical processing apparatus, the table comprising:
   a base surface;
   a plurality of burls protruding above the base surface, each of the plurality of burls having a respective burl distal end, the burl distal ends being arranged so as to support an object and defining a generally planar geometrical support surface;
   at least one gas extraction opening configured to extract gas from a gap between the base surface and the object when the object is being lowered onto the table,
   wherein the table is configured so that extraction of the gas from the gap is at a first loading flow rate when a distance between the object and the support surface is greater than a threshold distance and extraction of the gas from the gap is at a second loading flow rate when the distance between the object and the support surface is less than the threshold distance, wherein the second loading flow rate is lower than the first loading flow rate.

2. The table of claim 1, comprising at least one protrusion protruding above the base surface, each protrusion having a respective protrusion distal end,
   wherein the respective protrusion distal end is spaced at a loaded object distance from the support surface, and
   wherein each protrusion distal end is provided with a gas extraction opening of the at least one gas extraction opening, the gas extraction opening of a protrusion having a gas extraction opening diameter, wherein the loaded object distance is less than half the gas extraction opening diameter.

3. The table of claim 2, wherein the loaded object distance is less than one quarter of the gas extraction opening diameter.

4. The table of claim 1, further comprising:
   a buffer volume in fluid communication with the one or more gas extraction openings of the at least one protrusion, wherein the table is sized and arranged such that a flow rate of gas extracted from the gap through the one or more gas extraction openings of the at least one protrusion into the buffer volume reduces when the object touches down onto the table; and
   an underpressure source configured to extract gas from the buffer volume at a substantially constant rate before and after the object touches down onto the table.

5. The table of claim 4, further comprising a restriction configured to enable a choked flow of gas extracted from the buffer volume by the underpressure source.

6. The table of claim 4, configured such that after a flow rate of gas into the buffer volume is initially reduced when the object touches down onto the table, it takes at least 20 ms for the flow rate of gas into the buffer volume to return to a steady state value.

7. The table of claim 1, wherein the at least one gas extraction opening comprises a first group of the at least one gas extraction opening and a second group of the at least one gas extraction opening, wherein a gas extraction system is configured to stop extracting gas from the gap through the first group when the distance between the object and the support surface is less than the threshold distance.

8. The table of claim 7, configured such that gas from the gap is extracted through the first group at a first opening flow rate, and extracted from the gap through the second group at a second opening flow rate, wherein the first opening flow rate is greater than the second opening flow rate.

9. The table of claim 1, further comprising at least one gas supply opening configured to supply gas to the gap when the object is being raised away from the table, wherein each gas supply opening is separate from each gas extraction opening.

10. A table for a physical processing apparatus, the table comprising:
    a base surface;
    a plurality of burls protruding above the base surface, each of the plurality of burls having a respective burl distal end, the burl distal ends being arranged so as to support an object and defining a generally planar geometrical support surface;
    a first group of at least one gas extraction opening configured to extract gas from a gap between the base surface and the object when the object is being lowered onto the table; and
    a second group of at least one gas extraction opening configured to extract gas from a gap between the base surface and the object when the object is being lowered onto the table,
    wherein the first and second groups are separately controllable so as to extract gas from the gap through the first and second groups when the distance between the object and the support surface is greater than a threshold distance such that gas is extracted from the gap at a first loading flow rate and to stop extraction of gas from the gap through the first group but still extract gas from the gap through the second group when the distance between the object and the support surface is less than the threshold distance such that gas is extracted from the gap at a second loading flow rate, wherein the second loading flow rate is lower than the first loading flow rate.

11. The table of claim 10, configured to extract gas from the gap through the first group at a first opening flow rate, and to extract gas from the gap through the second group at a second opening flow rate, wherein the first opening flow rate is greater than the second opening flow rate.

12. The table of claim 10, further comprising:
    a buffer volume in fluid communication with one or more extraction openings selected from the first group and/or second group, wherein the table is sized and arranged such that a flow rate of gas extracted from the gap through the one or more extraction openings into the buffer volume reduces when the object touches down onto the table; and an underpressure source configured to extract gas from the buffer volume at a substantially constant rate before and after the object touches down onto the table.

13. The table of claim 12, further comprising a restriction configured to enable a choked flow of gas extracted from the buffer volume by the underpressure source.

14. The table of claim 12, configured such that after a flow rate of gas into the buffer volume is initially reduced when the object touches down onto the table, it takes at least 20 ms for the flow rate of gas into the buffer volume to return to a steady state value.

15. The table of claim 10, further comprising at least one gas supply opening configured to supply gas to the gap when the object is being raised away from the table, wherein each gas supply opening is separate from each gas extraction opening.

16. A table for a physical processing apparatus, the table comprising:
a base surface;
a plurality of burls protruding above the base surface, each of the plurality of burls having a respective burl distal end, the burl distal ends being arranged so as to support an object and defining a generally planar geometrical support surface;
at least one protrusion protruding above the base surface, each protrusion having a respective protrusion distal end spaced at a loaded object distance from the support surface; and
at least one gas extraction opening configured to extract gas from a gap between the base surface and the object when the object is being lowered onto the table,
wherein each protrusion distal end is provided with a gas extraction opening of the at least one gas extraction opening,
wherein each gas extraction opening of a protrusion has a gas extraction opening diameter, and
wherein the loaded object distance is less than half the gas extraction opening diameter.

17. The table of claim 16, wherein the loaded object distance is less than one quarter of the gas extraction opening diameter.

18. The table of claim 16, further comprising:
a buffer volume in fluid communication with the one or more gas extraction openings of the at least one protrusion, wherein the table is sized and arranged such that a flow rate of gas extracted from the gap between through the one or more gas extraction openings of the at least one protrusion into the buffer volume reduces when the object touches down onto the table; and
an underpressure source configured to extract gas from the buffer volume at a substantially constant rate before and after the object touches down onto the table.

19. The table of claim 16, wherein the at least one gas extraction opening comprises a first group of the at least one gas extraction opening and a second group of the at least one gas extraction opening, wherein a gas extraction system is configured to stop extracting gas from the gap through the first group when the distance between the object and the support surface is less than the threshold distance.

20. The table of claim 19, configured such that gas from the gap is extracted through the first group at a first opening flow rate, and extracted from the gap through the second group at a second opening flow rate, wherein the first opening flow rate is greater than the second opening flow rate.

* * * * *